(12) United States Patent
Choi et al.

(10) Patent No.: US 11,854,985 B2
(45) Date of Patent: Dec. 26, 2023

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Heejung Choi, Seongnam-si (KR); Heeseok Lee, Suwon-si (KR); Junghwa Kim, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 95 days.

(21) Appl. No.: 17/307,037

(22) Filed: May 4, 2021

(65) Prior Publication Data
US 2022/0077064 A1    Mar. 10, 2022

(30) Foreign Application Priority Data
Sep. 4, 2020   (KR) ........................ 10-2020-0112920

(51) Int. Cl.
*H01L 23/538* (2006.01)
*H01L 25/065* (2023.01)
*H01L 23/498* (2006.01)
*H01L 21/48* (2006.01)
(Continued)

(52) U.S. Cl.
CPC ........ *H01L 23/5383* (2013.01); *H01L 21/486* (2013.01); *H01L 23/49833* (2013.01); *H01L 24/19* (2013.01); *H01L 24/24* (2013.01); *H01L 25/0652* (2013.01); *H01L 25/0657* (2013.01); *H01L 25/50* (2013.01); *H01L 2224/24146* (2013.01)

(58) Field of Classification Search
CPC .......... H01L 23/5383; H01L 23/49833; H01L 24/19; H01L 24/24; H01L 25/0652; H01L 25/50
See application file for complete search history.

(56) References Cited

U.S. PATENT DOCUMENTS

| | | | |
|---|---|---|---|
| 7,327,554 B2 | 2/2008 | Otsuka et al. |
| 7,834,450 B2 | 11/2010 | Kang |
| 8,399,979 B2 | 3/2013 | Yamaji et al. |

(Continued)

FOREIGN PATENT DOCUMENTS

| | | |
|---|---|---|
| JP | 2005-223166 A | 8/2005 |
| JP | 5852929 B2 | 2/2016 |

*Primary Examiner* — Trang Q Tran
(74) *Attorney, Agent, or Firm* — Muir Patent Law, PLLC

(57) ABSTRACT

A semiconductor package includes: a first package including a first semiconductor chip; a second package under the first package, the second package including a second semiconductor chip; and a first interposer package between the first package and the second package, the first interposer package including: a power management integrated circuit (PMIC) configured to supply power to the first package and the second package; a core member having a through-hole in which the PMIC is disposed; a first redistribution layer on the core member, and electrically connected to the first package; a second redistribution layer under the core member, and electrically connected to the second package; core vias penetrating the core member, and electrically connecting the first redistribution layer with the second redistribution layer; and a first signal path electrically connecting the first package with the second package.

19 Claims, 22 Drawing Sheets

(51) Int. Cl.
    *H01L 23/00*     (2006.01)
    *H01L 25/00*     (2006.01)

(56) References Cited

U.S. PATENT DOCUMENTS

| | | |
|---|---|---|
| 8,519,537 B2 | 8/2013 | Jeng et al. |
| 9,059,696 B1 | 6/2015 | Rahman |
| 9,101,068 B2 | 8/2015 | Yun et al. |
| 9,167,694 B2 | 10/2015 | Sundaram et al. |
| 10,424,571 B2 | 9/2019 | Choi et al. |
| 2009/0109642 A1* | 4/2009 | Chung .................. H01L 23/498 |
| | | 361/783 |
| 2015/0069623 A1* | 3/2015 | Tsai ........................ H01L 23/31 |
| | | 257/774 |
| 2018/0068978 A1* | 3/2018 | Jeng ........................ H01L 25/50 |
| 2021/0305162 A1* | 9/2021 | Ganesan ............ H01L 23/5384 |

\* cited by examiner

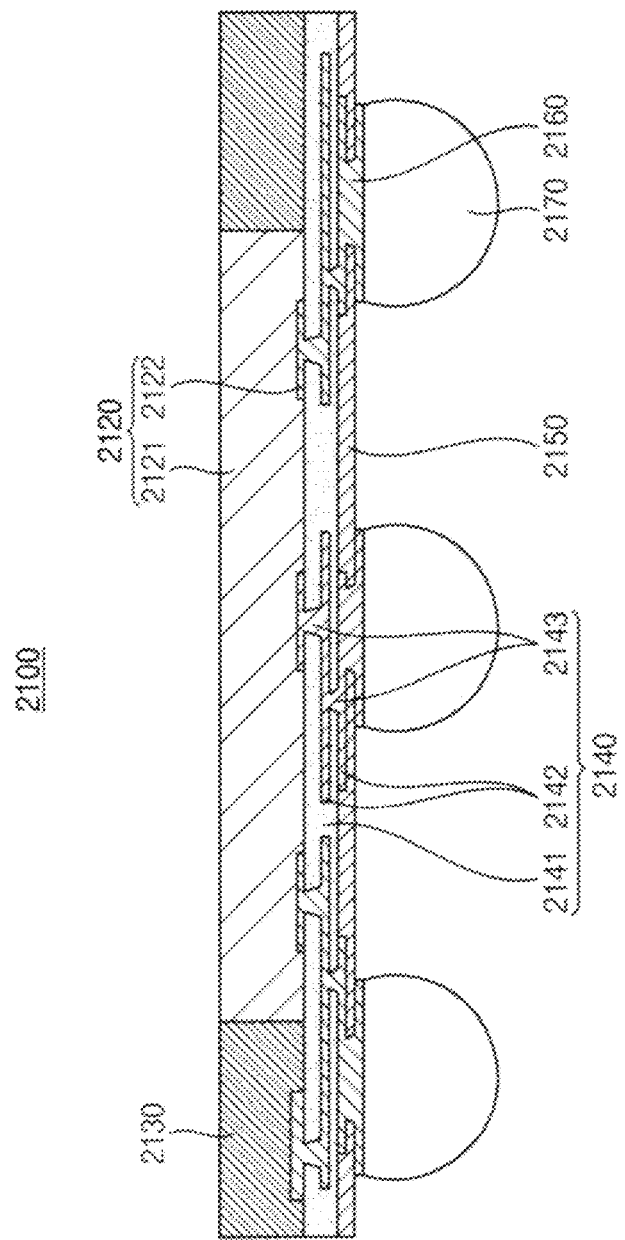

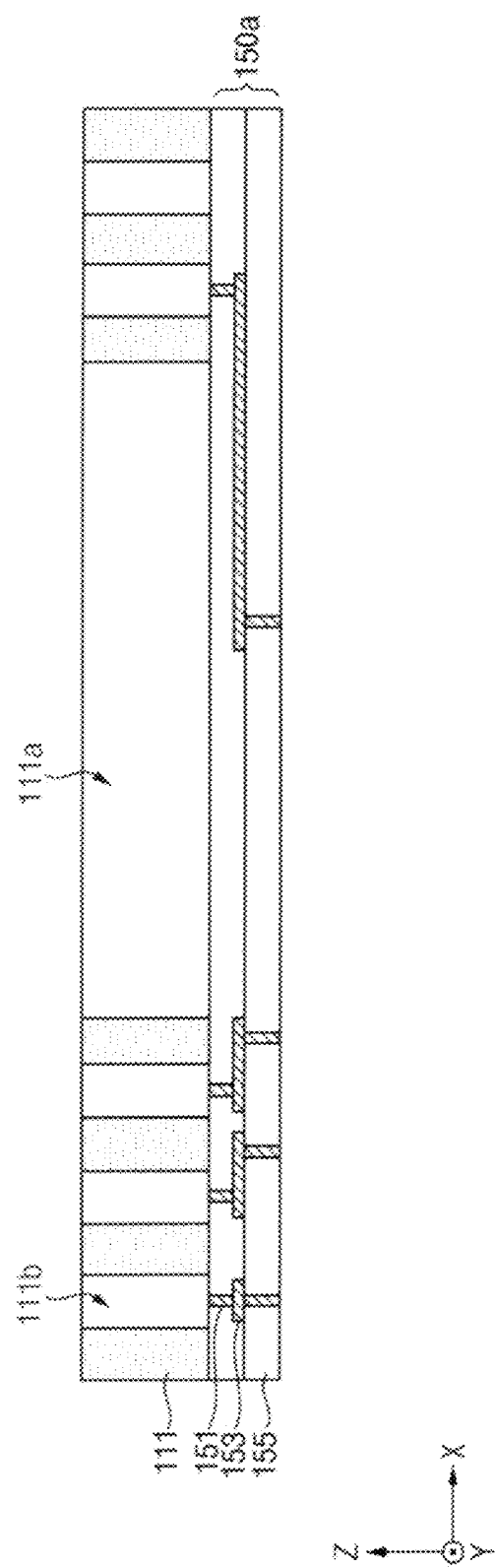

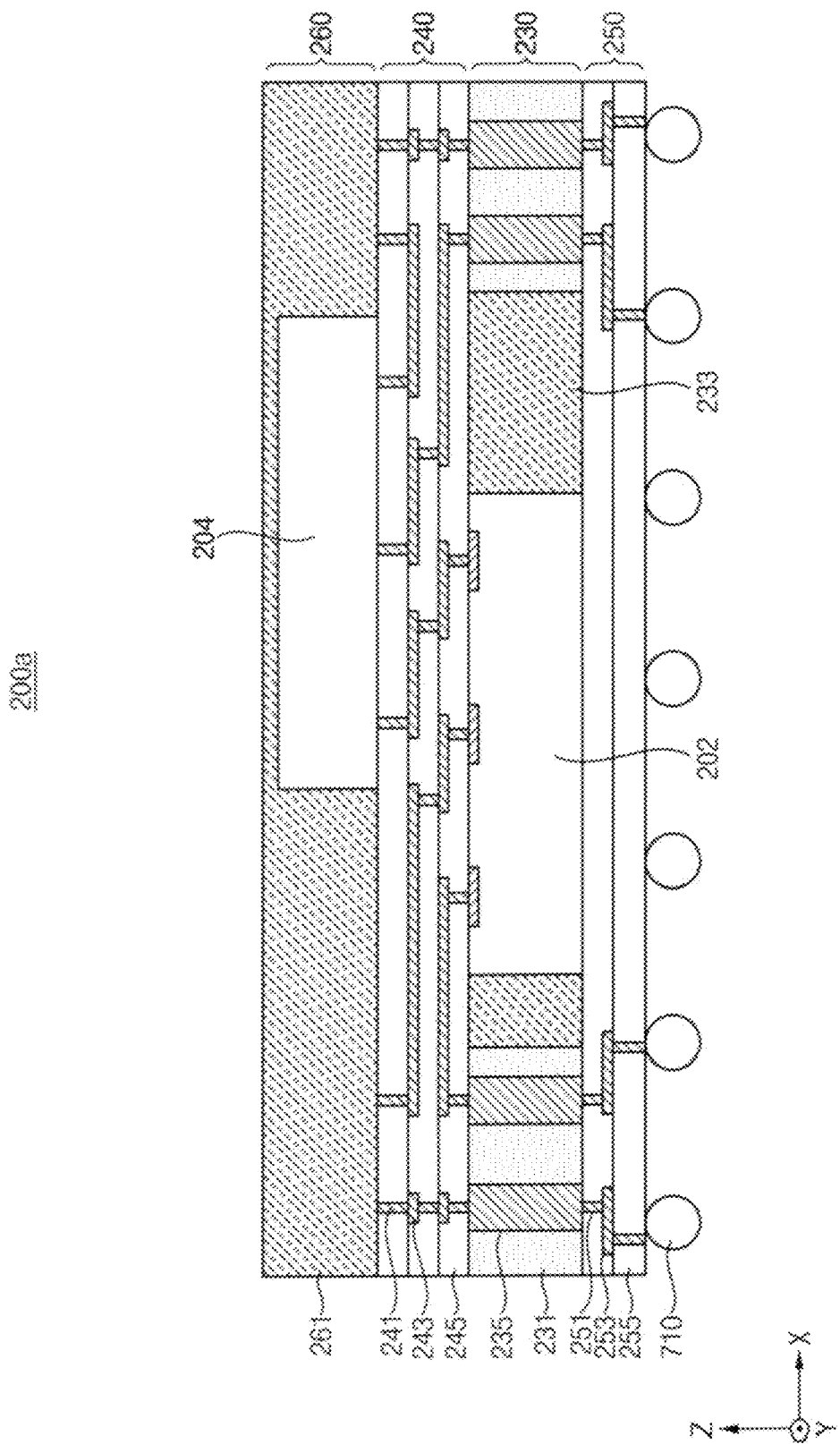

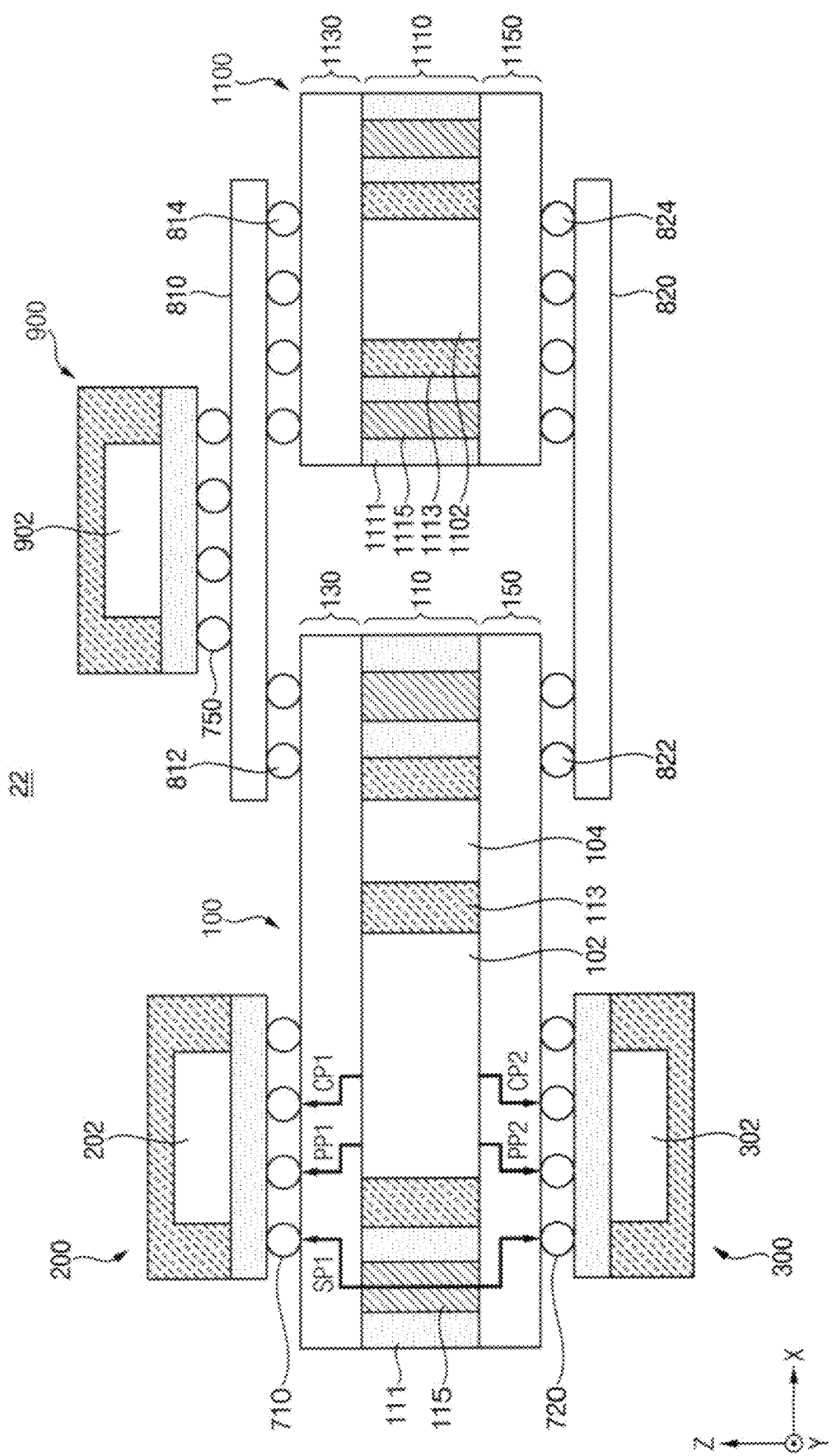

SEMICONDUCTOR PACKAGE AND METHOD OF MANUFACTURING THE SAME

CROSS-REFERENCE TO RELATED APPLICATION

Korean Patent Application No. 10-2020-0112920, filed on Sep. 4, 2020, in the Korean Intellectual Property Office, and entitled: "Semiconductor Package and Method of Manufacturing the Same," is incorporated by reference herein in its entirety.

BACKGROUND

1. Field

Embodiments relate to a semiconductor package and a method of manufacturing the same.

2. Description of the Related Art

A trend in the field of semiconductor chips has been the reduction in the size of semiconductor chips. Therefore, in the field of package technology, there has been an increased demand for semiconductor packages having a compact size while including a plurality of pins.

SUMMARY

Embodiments are directed to a semiconductor package, including: a first package including a first semiconductor chip; a second package under the first package, the second package including a second semiconductor chip; and a first interposer package between the first package and the second package, the first interposer package including: a power management integrated circuit (PMIC) configured to supply power to the first package and the second package; a core member having a through-hole in which the PMIC is disposed; a first redistribution layer on the core member, and electrically connected to the first package; a second redistribution layer under the core member, and electrically connected to the second package; core vias penetrating the core member, and electrically connecting the first redistribution layer with the second redistribution layer; and a first signal path electrically connecting the first package with the second package.

Embodiments are also directed to a method of manufacturing a semiconductor package, the method including: providing a first package including a first semiconductor chip; providing a second package including a second semiconductor chip; fabricating a first interposer package; and electrically connecting the first package, the second package, and the first interposer package by disposing the first interposer package between the first package and the second package. Fabricating the first interposer package may include: providing a core member; forming a through-hole and via-holes penetrating the core member; forming core vias in the via-holes; disposing a power management integrated circuit (PMIC) in the through-hole, the PMIC configured to supply power to the first package and the second package; forming a first redistribution layer on the core member, the first redistribution layer being electrically connected to the first package; and forming a second redistribution layer under the core member, the second redistribution layer being electrically connected to the second package, the core vias electrically connecting the first redistribution layer with the second redistribution layer. A first signal path that electrically connects the first package with the second package may be formed in the first interposer package by the first redistribution layer, the core vias, and the second redistribution layer.

Embodiments are also directed to a semiconductor package, including: a first package including a first semiconductor chip including an application processor; a second package under the first package, the second package including a second semiconductor chip including a memory device; a first interposer package between the first package and the second package; a plurality of first electrical connection structures between the first package and the first interposer package, and electrically connecting the first package with the first interposer package; and a plurality of second electrical connection structures between the first interposer package and the second package, and electrically connecting the first interposer package with the second package. The first interposer package may include: a power management integrated circuit (PMIC) configured to supply power to the first package and the second package; a passive element spaced apart from the PMIC; a core member having a through-hole in which the PMIC and the passive element are disposed; an encapsulant in the through-hole, and encapsulating the PMIC and the passive element; a first redistribution layer on the core member, and electrically connected to the first package; a second redistribution layer under the core member, and electrically connected to the second package; core vias penetrating the core member, and electrically connecting the first redistribution layer with the second redistribution layer; a first signal path electrically connecting the first package with the second package; and a power path configured to provide a power supply voltage to the first package and the second package. The first signal path may include at least one of first vias and at least one of first wirings that are included in the first redistribution layer, at least one of the core vias, and at least one of second vias and at least one of second wirings that are included in the second redistribution layer.

BRIEF DESCRIPTION OF THE DRAWINGS

Features will become apparent to those of skill in the art by describing in detail example embodiments with reference to the attached drawings in which:

FIGS. 2A and 2B are diagrams for describing a structure of a fan-out package included in a semiconductor package according to an example embodiment.

FIGS. 4A, 4B, 4C, 4D and 4E are cross-sectional views for describing a method of manufacturing a first interposer package of FIG. 3A.

FIG. 7 is a cross-sectional view of another example of a first package included in a semiconductor package of FIG. 1.

FIG. 13 is a cross-sectional view of a semiconductor package according to an example embodiment.

DETAILED DESCRIPTION

Figure 1:
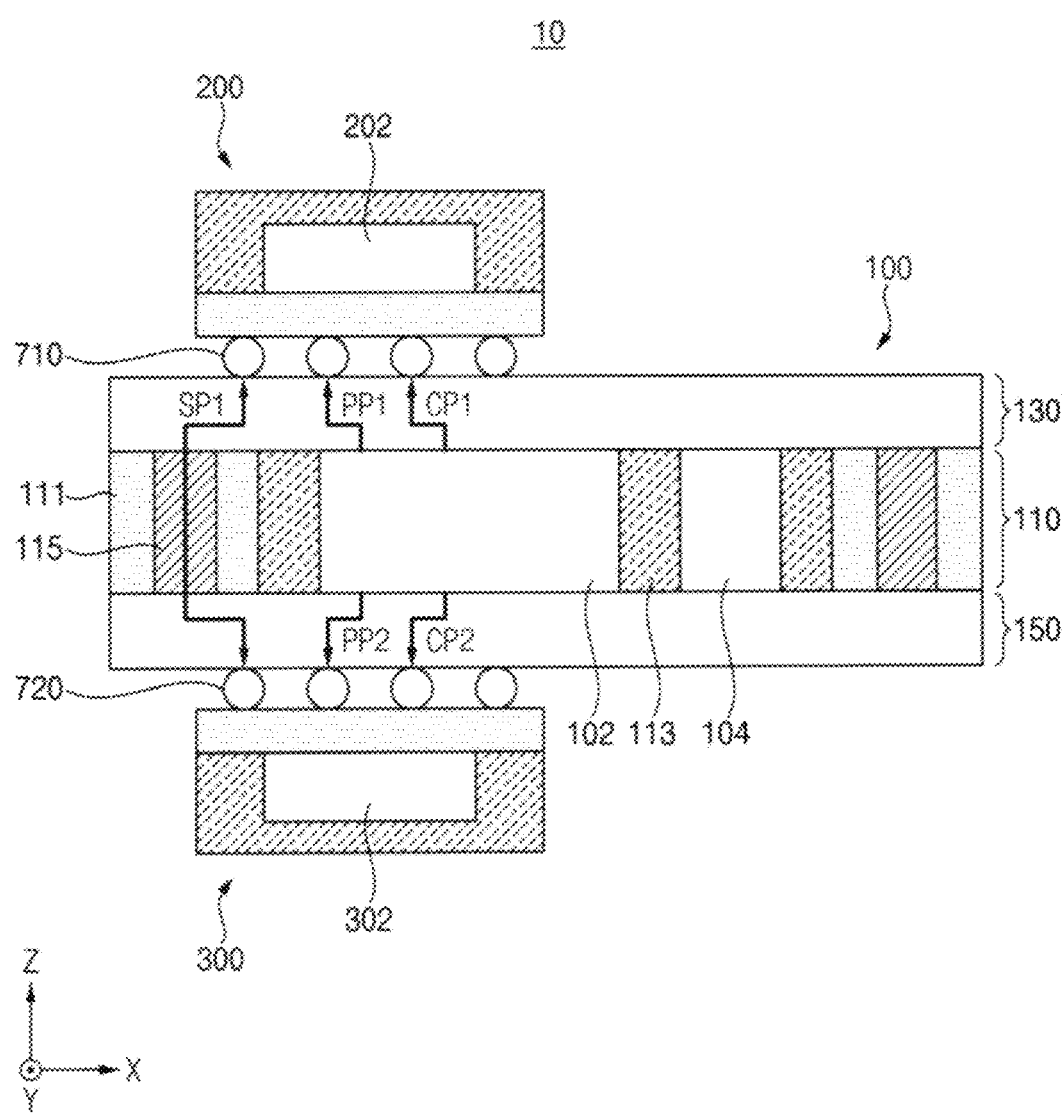
FIG. 1 is a cross-sectional view of a semiconductor package according to an example embodiment.

FIG. 1 is a cross-sectional view of a semiconductor package according to an example embodiment.

In FIG. 1, two directions substantially parallel to a first surface (e.g., a top surface) of a substrate (or a package package) and crossing each other are referred to as a first direction X (e.g., a first horizontal direction) and a second direction Y (e.g., a second horizontal direction). In addition, a direction substantially vertical to the first surface of the substrate is referred to as a third direction Z (e.g., a vertical direction). For example, the first and second directions X and Y may be substantially perpendicular to each other. In addition, the third direction Z may be substantially perpendicular to both the first and second directions X and Y. Further, a direction indicated by an arrow in the figures and a reverse direction thereof are considered as the same direction. The definition of the first, second, and third directions X, Y, and Z are same in the subsequent figures.

Referring to FIG. 1, a semiconductor package 10 may include a first interposer package 100, a first package 200, and a second package 300. The semiconductor package 10 may further include a plurality of electrical connection structures 710 and 720.

The first package 200 may include a first semiconductor chip 202. The second package 300 may include a second semiconductor chip 302, and may be under the first package 200.

The first interposer package 100 may be between the first package 200 and the second package 300. Thus, the first package 200 may be on or above the first interposer package 100, and the second package 300 may be under or below the first interposer package 100.

The first interposer package 100 may include a core layer 110, a first redistribution layer 130, a second redistribution layer 150, and a first signal path SP1. The first interposer package 100 may further include power paths PP1 and PP2 and power control paths CP1 and CP2.

The core layer 110 may include a power management integrated circuit (PMIC) 102, a core member 111, and core vias 115. The core layer 110 may further include a passive element 104 and an encapsulant (or a sealing member) 113.

The core member 111 may maintain rigidity of the first interposer package 100 depending on a specific material. The core member 111 may include a through-hole (e.g., a through-hole 111a in FIG. 4B) in which the PMIC 102 and the passive element 104 are disposed. The core member 111 may be referred to as a package substrate.

The PMIC 102 may be in the through-hole 111a of the core member 111. The PMIC 102 may supply power to the first package 200 and the second package 300 (e.g., to the first semiconductor chip 202 and the second semiconductor chip 302). For example, the PMIC 102 may provide at least one power supply voltage to the first and second packages 200 and 300 through the power paths PP1 and PP2, and may control the provision of the power supply voltage through the power control paths CP1 and CP2. The PMIC 102 may be implemented in the form of a semiconductor chip.

The passive element 104 may be in the through-hole 111a of the core member 111, and may be spaced apart from the PMIC 102. The passive element 104 may include a capacitor, an inductor, or the like. The passive element 104 may operate associated with or related to the above-described operation of supplying the power by the PMIC 102.

Although FIG. 1 illustrates only one PMIC 102 and one passive element 104, the number of PMICs and passive elements may be changed according to example embodiments.

The encapsulant 113 may be formed in the through-hole 111a of the core member 111, and may encapsulate the PMIC 102 and the passive element 104.

The core vias 115 may penetrate the core member 111, and may electrically connect the first redistribution layer 130 with the second redistribution layer 150. Thus, electrical paths may be formed by the core vias 115 in the core layer 110.

The first redistribution layer 130 may be on the core member 111, and may be electrically connected to the first package 200. The second redistribution layer 150 may be under the core member 111, and may be electrically connected to the second package 300. As will be described with reference to FIG. 3, each of the first and second redistribution layers 130 and 150 may include a plurality of vias and a plurality of wirings for redistributing the PMIC 102 or for electrical connection with the first and second packages 200 and 300, and may include a plurality of insulating layers.

The first signal path SP1 may electrically connect the first package 200 with the second package 300. For example, as will be described with reference to FIG. 3, the first signal path SP1 may include at least one of first vias and at least one of first wirings that are included in the first redistribution layer 130, at least one of the core vias 115, and at least one of second vias and at least one of second wirings that are included in the second redistribution layer 150. The first package 200 and the second package 300 may exchange signals through the first signal path SP1.

The power paths PP1 and PP2 may provide the power supply voltage, which is generated by the PMIC 102, to the first package 200 and the second package 300. The power control paths CP1 and CP2 may provide control signals to the first package 200 and the second package 300. The control signals may be generated by the PMIC 102 and may be signals for controlling the provision of the power supply voltage. For example, each of the power paths PP1 and PP2 and the power control paths CP1 and CP2 may include at least one of third vias and at least one of third wirings that are included in the first redistribution layer 130, and/or at least one of fourth vias and at least one of fourth wirings that are included in the second redistribution layer 150, and may further include at least one of the core vias 115.

An example structure and manufacturing process of the first interposer package 100 that includes the PMIC 102, the passive element 104, the first signal path SP1, the power paths PP1 and PP2, etc. will be described with reference to FIGS. 3 through 5. In addition, an example structure and manufacturing process of the first package 200 that includes the first semiconductor chip 202 will be described with reference to FIGS. 6 and 7.

Each of the PMIC 102 and the first and second semiconductor chips 202 and 302 may be an integrated circuit (IC) in a bare state, provided with several hundreds to several millions of elements or more integrated in a single chip.

Each semiconductor chip may include a body on which various circuits are formed, and pads may be formed on an active surface of the body. The body may be formed on the basis of, for example, an active wafer, and silicon (Si), germanium (Ge), gallium arsenide (GaAs), or the like, may be used as a basic material of the body. The pads may electrically connect each semiconductor chip to other components, and materials of the pads may be a conductive material such as aluminum (Al), for example. Although not illustrated in FIG. 1, a passivation layer having openings exposing at least portions of the pads and formed of an oxide layer, a nitride layer, or the like, may be formed on the active surface of each semiconductor chip. A pad may be a contact pad or a contact pin, for example. In addition, although not illustrated in FIG. 1, solder bumps for electrical connection may be formed on the pads of each semiconductor chip.

In some example embodiments, the first and second semiconductor chips 202 and 302 may be semiconductor chips of different types from the PMIC 102, and the first and second semiconductor chips 202 and 302 may be semiconductor chips of different types from each other. For example, one of the first and second semiconductor chips 202 and 302 may include an application processor (AP), and the other of the first and second semiconductor chips 202 and 302 may include a memory device. For example, the memory device may include at least one of various volatile memory devices, e.g., a dynamic random access memory (DRAM), a static random access memory (SRAM), or the like, and/or at least one of various nonvolatile memory devices, e.g., an electrically erasable programmable read-only memory (EEPROM), a flash memory, a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), or the like. For example, the semiconductor chip including the memory device may further include a memory controller that controls the memory device. However, example embodiments are not limited thereto, and types of the first and second semiconductor chips 202 and 302 may be changed according to example embodiments. For example, one of the first and second semiconductor chips 202 and 302 may include at least one of various data processing devices, and the other of the first and second semiconductor chips 202 and 302 may include a communication device, a display driving device, or the like that are controlled by the data processing device.

In some example embodiments, the first interposer package 100 may be a fan-out package (or a fan-out semiconductor package). The signal paths in the fan-out package may be reduced by forming the signal paths by the vias and the wirings in the redistribution layers 130 and 150, rather than by wire bondings, and thus the signal loss may also be reduced. Thus, the electrical characteristics of signals may be improved or enhanced in the fan-out package. The fan-out package may have excellent reliability as compared to a fan-in package, may implement a plurality of input/output (I/O) terminals, and may facilitate a three-dimensional (3D) interconnection. In addition, as compared to a ball grid array (BGA) package, a land grid array (LGA) package, or the like, the fan-out package may be manufactured to have a small thickness, and may have price competitiveness. However, example embodiments are not limited thereto, and the redistribution layers 130 and 150 may be replaced with printed circuit boards (PCBs).

In some example embodiments, the core member 111 included in the first interposer package 100 may include a PCB substrate (or a PCB panel), and thus the first interposer package 100 may be a panel level package (PLP). The PLP may be manufactured based on the PCB substrate (e.g., manufactured by forming holes penetrating the PCB substrate, by disposing a semiconductor chip in some of the holes, and by forming core vias in others of the holes), and thus the core member 111 for the rigidity of the package and the encapsulant 113 for the protection and/or insulation of the semiconductor chip may coexist in the core layer 110. The PLP may have relatively high productivity, may have relatively high reliability such as high impact resistance and excellent bending characteristics, and may be relatively easy to implement an integrated package including various components. However, example embodiments are not limited thereto, and the first interposer package 100 may be a wafer level package (WLP) that is manufactured based on a wafer.

The plurality of electrical connection structures 710 may be between the first interposer package 100 and the first package 200, and may electrically connect the first interposer package 100 with the first package 200. The plurality of electrical connection structures 720 may be between the first interposer package 100 and the second package 300, and may electrically connect the first interposer package 100 with the second package 300.

In some example embodiments, at least one of the plurality of electrical connection structures 710 and 720 may be in a fan-out region of the fan-out package. The fan-out region may represent a region other than a region in which a semiconductor chip (e.g., the PMIC 102) is disposed.

In some example embodiments, the first interposer package 100, the first package 200 and the second package 300 may be individually, independently, and separately manufactured through separate processes, and then may be electrically connected to each other by the plurality of electrical connection structures 710 and 720. Thus, the first interposer package 100, the first package 200, and the second package 300 may not be manufactured by being integrated and/or combined in a single process, but may be separately manufactured and then form one semiconductor package 10 in a manner that is electrically connected to each other through a subsequent process. Thus, in the semiconductor package 10, the first interposer package 100, the first package 200 and the second package 300 may be formed to be spaced apart from each other in the vertical direction Z, a bottom surface of the first package 200 and a top surface of the first interposer package 100 may be spaced apart from each other by a predetermined distance, and a bottom surface of the first interposer package 100 and a top surface of the second package 300 may be spaced apart from each other by a predetermined distance. Although not illustrated in detail, a dielectric layer including an air or a dielectric material may be formed between the first package 200 and the first interposer package 100, and/or between the first interposer package 100 and the second package 300.

The semiconductor package 10 according to an example embodiment may include the first interposer package 100 having a multi-function double side interposer structure. The first interposer package 100 may include components (e.g., the PMIC 102 and the passive element 104) for supplying the power, and may also include a component (e.g., the first signal path SP1) for electrically connecting the first and second packages 200 and 300 on the upper and lower surfaces of the first interposer package 100. The first interposer package 100 may be implemented in the form of superset including all of the above-described components, and thus the semiconductor package 10 may have relatively simplified wirings, simplified configurations, reduced size, and/or thin thickness.

Figure 2B:
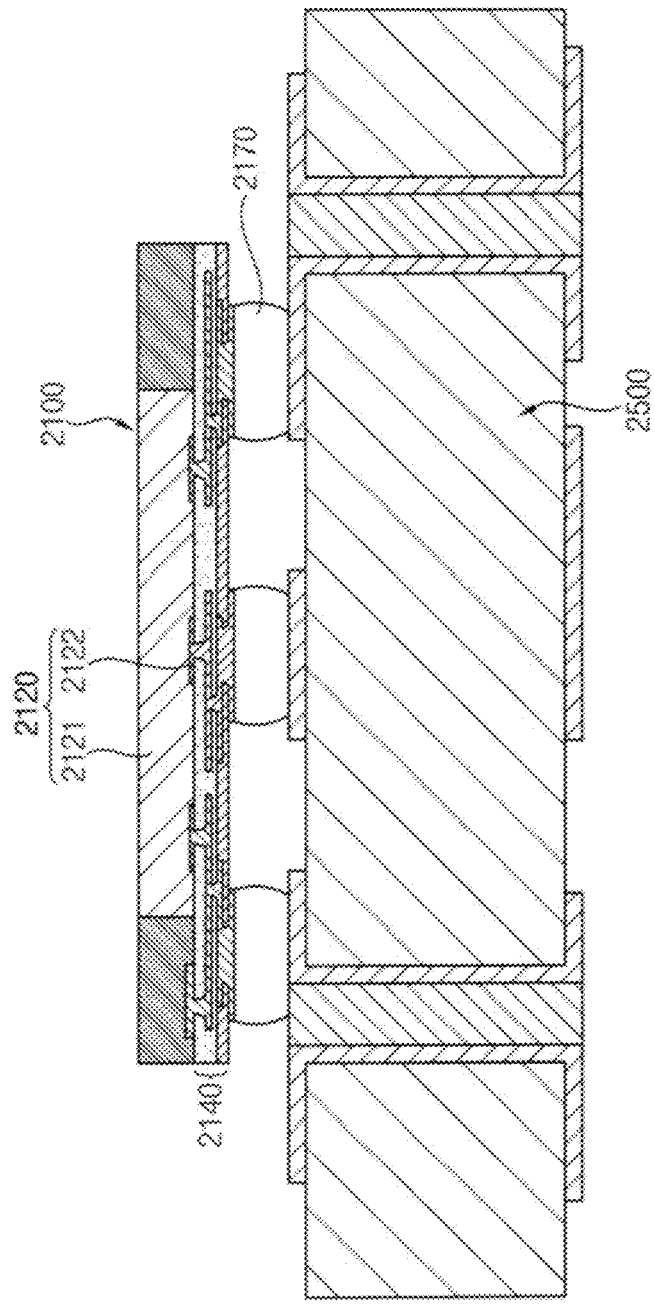

FIGS. 2A and 2B are diagrams for describing a structure of a fan-out package included in a semiconductor package according to an example embodiment.

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip may not be used by itself, but may instead be packaged and used in an electronic device or system, or the like, in a packaged state.

Here, semiconductor packaging is beneficial due to the existence of a difference in a circuit width between the semiconductor chip and a printed circuit board (e.g., a mainboard) of the electronic device in terms of electrical connections. In detail, a size of connection pads (or pads) in the semiconductor chip and an interval between the connection pads in the semiconductor chip are very fine, but a size of component mounting pads in the printed circuit board used in the electronic device and an interval between the component mounting pads of the printed circuit board are significantly larger than those of the semiconductor chip. Therefore, it may be difficult to directly mount the semiconductor chip on the printed circuit board, and packaging technology for buffering a difference in a circuit width between the semiconductor chip and the printed circuit board may be beneficial.

A semiconductor package manufactured by the packaging technology may be classified as a fan-in semiconductor package (or a fan-in package) or a fan-out semiconductor package (or a fan-out package) depending on a structure and a purpose thereof.

Referring to FIG. 2A, in a fan-out package 2100, for example, an outer side of a semiconductor chip 2120 may be protected by an encapsulant 2130, and pads 2122 of the semiconductor chip 2120 may be redistributed outwardly of the semiconductor chip 2120 by a connection member 2140. A passivation layer 2150 may be formed on the connection member 2140, and an underbump metal layer 2160 may be formed in openings of the passivation layer 2150. Solder balls 2170 may be formed on the underbump metal layer 2160. The semiconductor chip 2120 may be an integrated circuit (IC) including a body 2121, the pads 2122, a passivation layer (not illustrated), and the like. The connection member 2140 may include an insulating layer 2141, redistribution layers 2142 formed on the insulating layer 2141, and vias 2143 electrically connecting the pads 2122 with the redistribution layers 2142.

As described above, the fan-out package may have a form in which I/O terminals of the semiconductor chip are redistributed and disposed outwardly of the semiconductor chip through the connection member formed on the semiconductor chip. In a fan-in package, all I/O terminals of the semiconductor chip are inside the semiconductor chip. Therefore, when a size of the semiconductor chip is decreased, a size and a pitch of balls is also decreased, such that a standardized ball layout may not be suitable for the fan-in package. On the other hand, the fan-out package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out package may be mounted on the printed circuit board of the electronic device without using a separate BGA substrate, as will be described below.

Referring to FIG. 2B, the fan-out package 2100 may be mounted on a printed circuit board 2500 of an electronic device through the solder balls 2170, or the like. As described above, the fan-out package 2100 may include the connection member 2140 formed on the semiconductor chip 2120 and redistributing the pads 2122 to a fan-out region that is outside of a size of the semiconductor chip 2120, such that the standardized ball layout may be used in the fan-out package 2100 as it is. As a result, the fan-out package 2100 may be mounted on the printed circuit board 2500 of the electronic device without using a separate BGA substrate, or the like.

As described above, the fan-out package may be mounted on the printed circuit board of the electronic device without using the separate BGA substrate. Thus, the fan-out package may be implemented with a thickness that is less than that of the fan-in package using the BGA substrate. Therefore, the fan-out package may be miniaturized and thinned. In addition, the fan-out package may have excellent thermal characteristics and electrical characteristics, such that it is particularly appropriate for a mobile product.

Figure 3A:
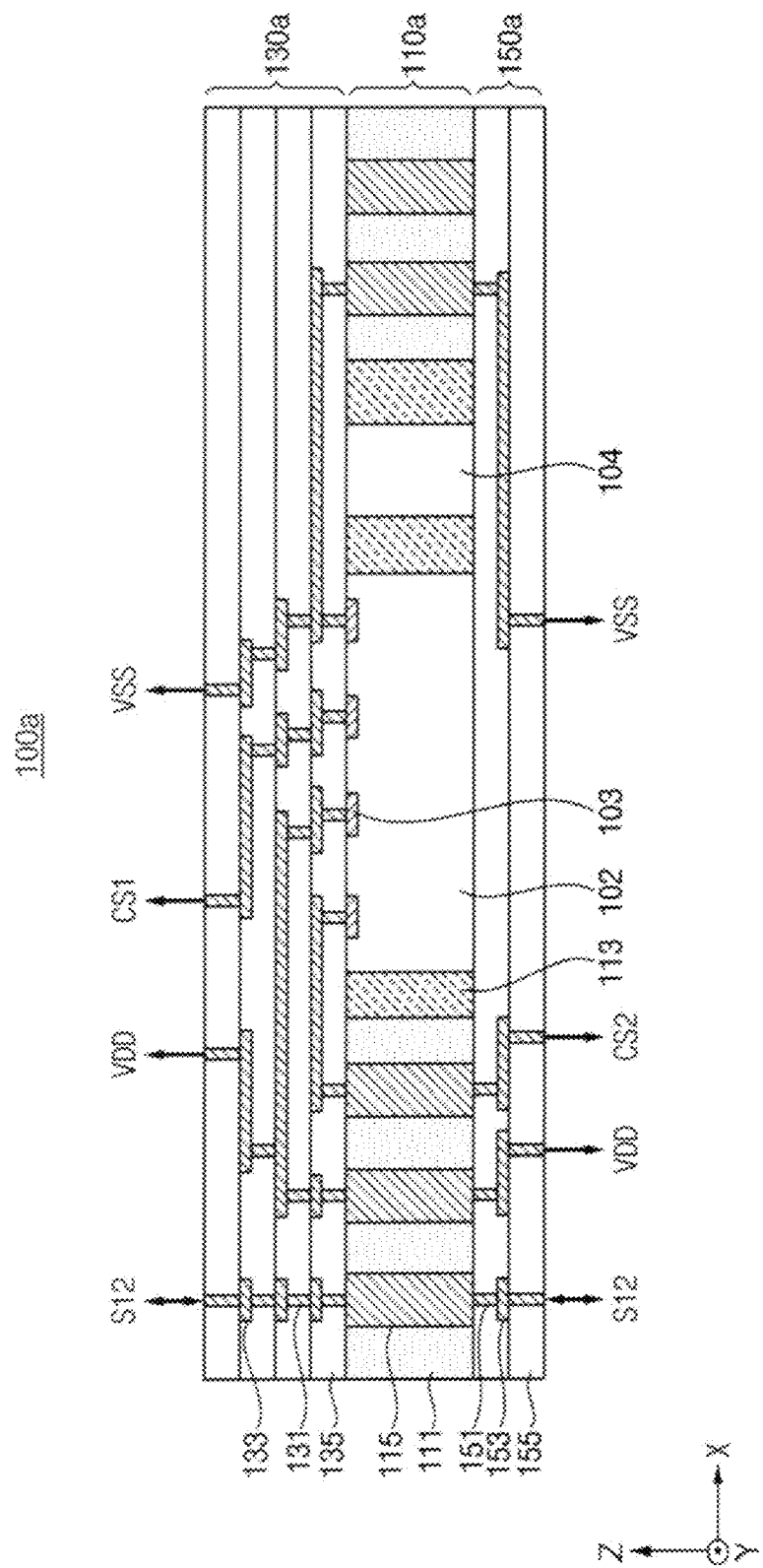
FIGS. 3A and 3B are diagrams illustrating an example of a first interposer package included in a semiconductor package of FIG. 1.
Figure 3B:
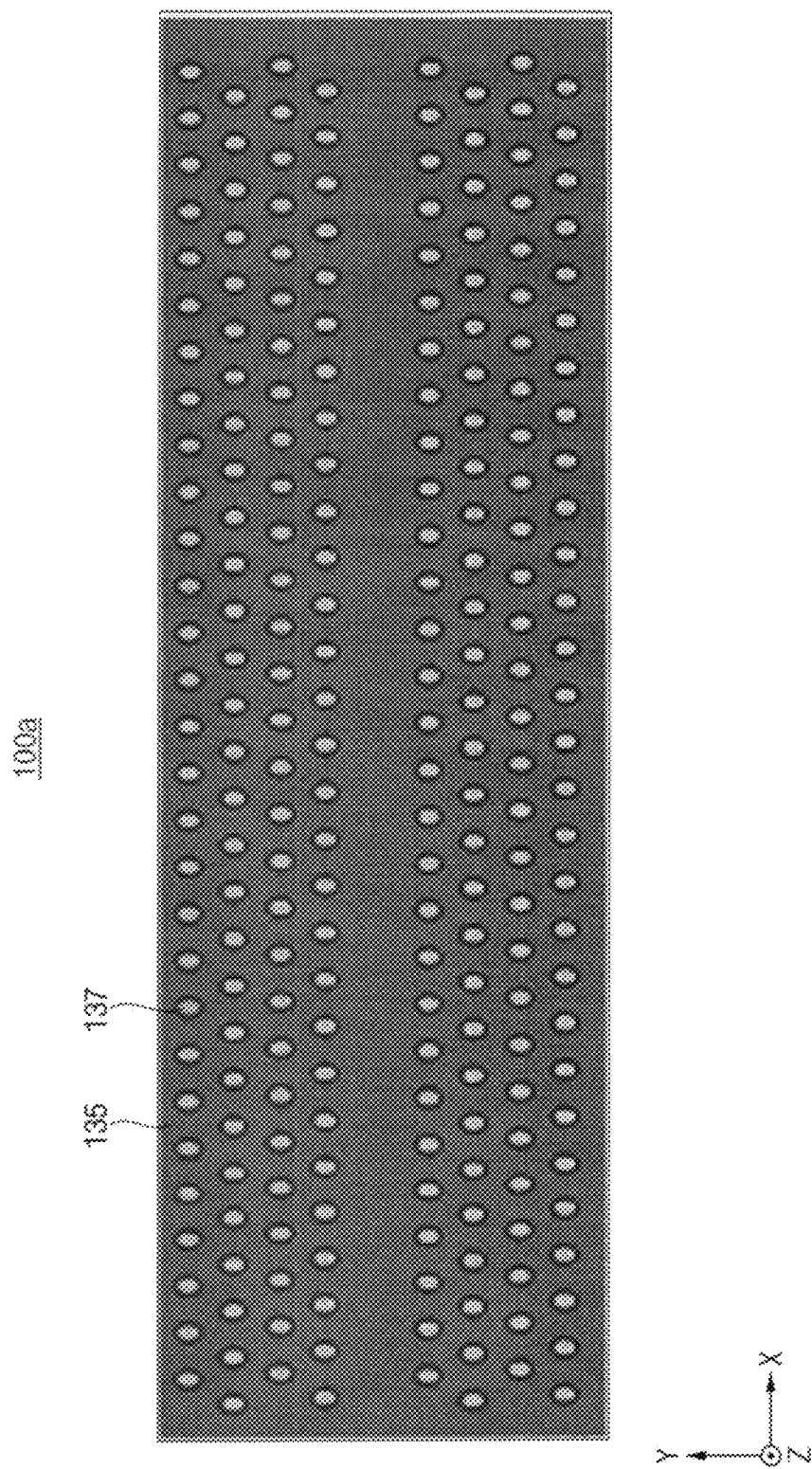

FIGS. 3A and 3B are diagrams illustrating an example of a first interposer package included in a semiconductor package of FIG. 1.

Referring to FIGS. 3A and 3B, a first interposer package 100a may include a core layer 110a, a first redistribution layer 130a, and a second redistribution layer 150a.

The core layer 110a may include a PMIC 102, a passive element 104, a core member 111, an encapsulant 113, and core vias 115.

The PMIC 102 may include an active surface having pads 103 thereon, and may include an inactive surface opposite to the active surface. In the example of FIG. 3A, the PMIC 102 may be disposed in face-up form such that the active surface is directed toward the first package 200.

The passive element 104, the core member 111, the encapsulant 113, and the core vias 115 may be substantially the same as the passive element 104, the core member 111, the encapsulant 113, and the core vias 115 in FIG. 1, respectively.

The first redistribution layer 130a may include a plurality of vias 131 and a plurality of wirings 133 for redistributing the pads 103 of the PMIC 102 or for electrical connection with the first package 200, and may include a plurality of insulating layers 135 for electrically insulating at least portions of the plurality of wirings 133.

As illustrated in FIG. 3B, a plurality of solder balls (or solder bumps) 137 may be formed on the uppermost insulating layer of the plurality of insulating layers 135. In the first interposer package 100a according to an example embodiment, the plurality of solder balls 137 may not be formed only on edges of the uppermost insulating layer, but may be uniformly formed on the entire of the uppermost insulating layer. The electrical connection with the first package 200 may be implemented through the plurality of solder balls 137.

The second redistribution layer 150a may include a plurality of vias 151 and a plurality of wirings 153 for redistributing the pads 103 of the PMIC 102 or for electrical connection with the second package 300, and may include a plurality of insulating layers 155 for electrically insulating at least portions of the plurality of wirings 153.

Although not illustrated, a plurality of solder balls may be formed under the lowermost insulating layer of the plurality of insulating layers 155, similar to that illustrated in FIG. 3B.

In some example embodiments, the core vias 115, the vias 131 and 151, and the wirings 133 and 153 may include vias and wirings for ground (GND), vias and wirings for power (PWR), and vias and wirings for signals, and the like. The vias and wirings for signals may include vias and wirings for various signals other than the ground and the power, such as data signals, and the like.

In some example embodiments, a path for transmitting a signal S12 exchanged between the first package 200 and the second package 300 in the first interposer package 100a may form the first signal path SP1 in FIG. 1. Thus, in an example of FIG. 3A, the first signal path SP1 may include at least one of the core via 115, at least one of the vias 131 and 151, and at least one of the wirings 133 and 153.

In some example embodiments, paths for transmitting a power supply voltage VDD and a ground voltage VSS provided to the first and second packages 200 and 300 in the first interposer package 100a may form the power paths PP1 and PP2 in FIG. 1. Thus, in an example of FIG. 3A, the power path PP1 for transmitting the power supply voltage VDD and the ground voltage VSS to the first package 200 may include at least one of the vias 131 and at least one of the wirings 133, and the power path PP2 for transmitting the power supply voltage VDD and the ground voltage VSS to the second package 300 may include at least one of the core vias 115, at least one of the vias 131 and 151, and at least one of the wirings 133 and 153.

In some example embodiments, paths for transmitting control signals CS1 and CS2 provided to the first and second packages 200 and 300 in the first interposer package 100a may form the power control paths CP1 and CP2 in FIG. 1. Thus, in the example of FIG. 3A, the power control path CP1 for transmitting the control signal CS1 to the first package 200 may include at least one of the vias 131 and at least one of the wirings 133, and the power control path CP2 for transmitting the control signal CS2 to the second package 300 may include at least one of the core vias 115, at least one of the vias 131 and 151, and at least one of the wirings 133 and 153.

FIGS. 4A, 4B, 4C, 4D, and 4E are cross-sectional views for describing a method of manufacturing a first interposer package of FIG. 3A.

Figure 4A:
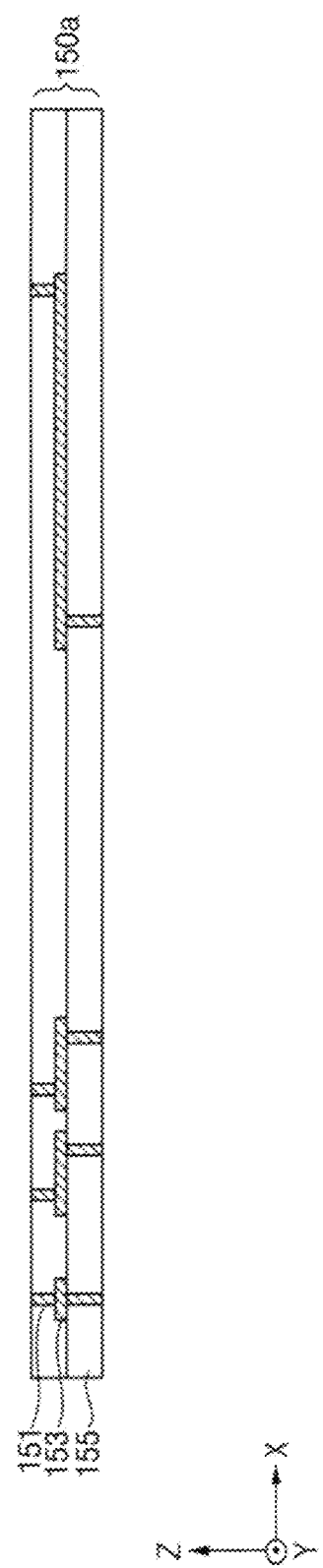

Referring to FIG. 4A, the second redistribution layer 150a of the first interposer package 100a may be formed. For example, a supporting substrate or a carrier (not illustrated) may be provided, and the lowermost insulating layer of the plurality of insulating layers 155 may be formed on the supporting substrate by a lamination process or any known applying process. After that, via-holes may be formed in the lowermost insulating layer by a photolithography process. After that, some of the vias 151 and some of the wirings 153 in or on the lowermost insulating layer may be formed by a plating process. The plating process may be a subtractive process, an additive process, a semi-additive process (SAP), a modified semi-additive process (MSAP), or the like, for example. In a similar manner, the remaining of the insulating layers 155, the remaining of the vias 151, and the remaining of the wirings 153 may be sequentially formed.

The plurality of insulating layers 155 may include an insulating material. For example, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), and/or the like.

In an example embodiment, at least a portion of the plurality of insulating layers 155 may include a photosensitive insulating material such as a photoimageable dielectric (PID) resin to provide a photosensitive insulating layer. When the insulating layer 155 has photosensitive properties, the insulating layer 155 may be formed to have a lower thickness, and a fine pitch of the vias 151 may be achieved more easily. The insulating layer 155 may be a photosensitive insulating layer including an insulating resin and an inorganic filler. When the insulating layers 155 are multiple layers, materials of the insulating layers 155 may be the same as each other, or may be different from each other. When the insulating layers 155 are multiple layers, the insulating layers 155 may be integrated with each other depending on a process, such that a boundary therebetween may not be apparent.

In an example embodiment, the lowermost insulating layer of the plurality of insulating layers 155 may be a passivation layer. The passivation layer may protect the first interposer package 100a from external physical and/or chemical damage. The passivation layer may include an insulating resin and an inorganic filler. In an implementation, the passivation layer does not include a glass fiber. The passivation layer may be formed of an ABF, a PID, a solder resist, and/or the like, for example. The passivation layer may be formed by a suitable lamination process, hardening process, or the like.

In some example embodiments, the plurality of vias 151 and the plurality of wirings 153 may include a conductive material such as copper (Cu), aluminum (Al), silver (Ag), tin (Sn), gold (Au), nickel (Ni), lead (Pb), titanium (Ti), and/or alloys thereof.

Referring to FIG. 4B, the core member 111 having the through-hole 111a and via-holes 111b may be formed on the second redistribution layer 150a. The core member 111 may include a PCB substrate, for example.

For example, the core member 111 may be provided or prepared, and the through-hole 111a and the via-holes 111b penetrating the core member 111 may be formed. For example, the through-hole 111a and the via-holes 111b may be formed using a mechanical drill, a laser drill, or the like, but are not limited thereto. After that, the core member 111 may be disposed and fixed (or adhered) on the second redistribution layer 150a. After the core member 111 is disposed on the second redistribution layer 150a, the supporting substrate for forming the second redistribution layer 150a may be removed.

Figure 4C:
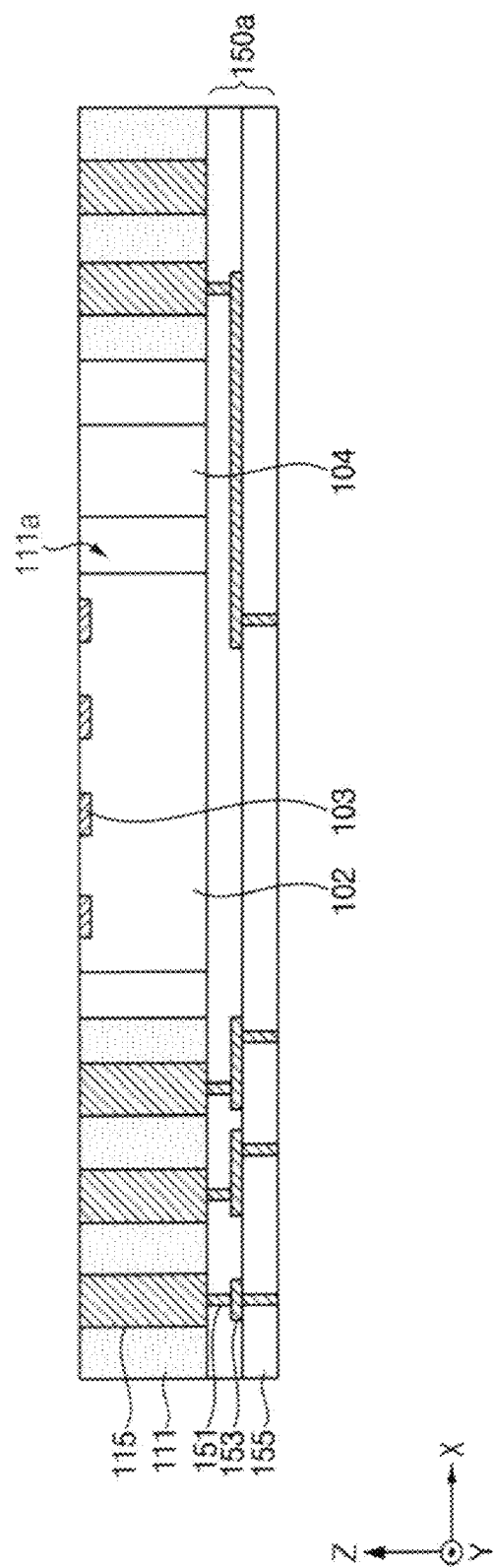

Referring to FIG. 4C, the core vias 115 may be formed in the via-holes 111b of the core member 111, and the PMIC 102 and the passive element 104 may be disposed in the through-hole 111a of the core member 111. The core vias 115 may be used for electrically connecting the first redistribution layer 130a with the second redistribution layer 150a.

The core vias 115 may be formed by the plating process described above, for example. The PMIC 102 and the passive element 104 may be on the second redistribution layer 150a exposed through the through-hole 111a. Although not illustrated in detail, an adhesive film for attaching the PMIC 102 and the passive element 104 may be interposed between the core member 111 and the second redistribution layer 150a.

In some example embodiments, materials of the core vias 115 may be a conductive material such as copper (Cu), aluminum (Al), silver (Ag), tin (Sn), gold (Au), nickel (Ni), lead (Pb), titanium (Ti), and/or alloys thereof. Each of the core vias 115 may be entirely filled with the conductive material, or the conductive material may be formed along a wall of respective one of the via-holes 111*b*, for example. In addition, each of the core vias 115 may have any known shape such as an hourglass shape, a cylindrical shape, and the like.

In some example embodiments, the core vias 115 may be formed first, and then the PMIC 102 and the passive element 104 may be disposed, but the order is not limited thereto.

Figure 4D:
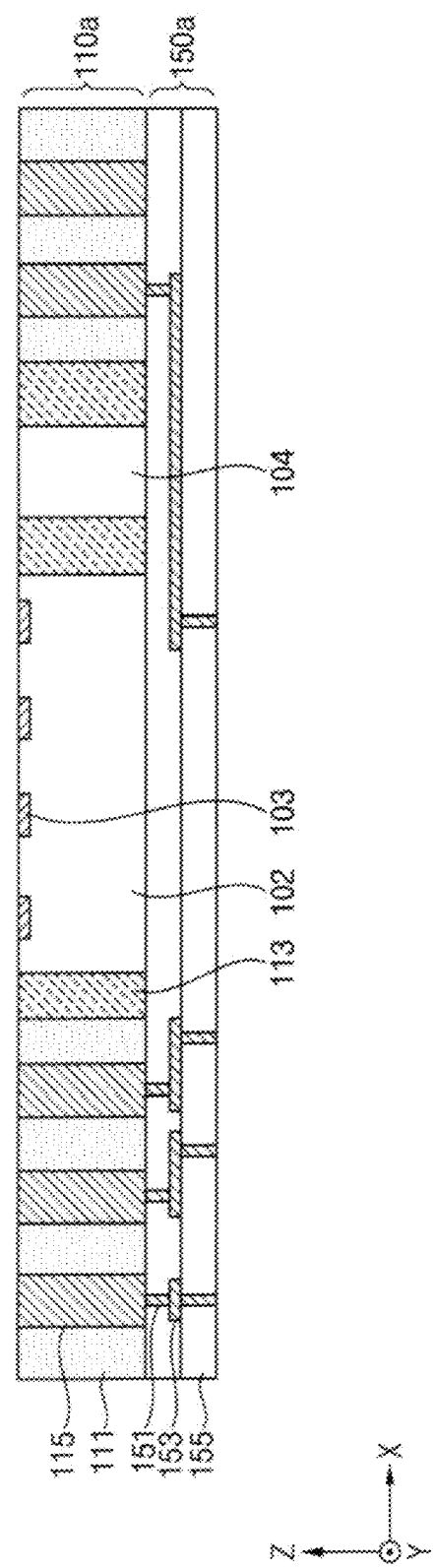

Referring to FIG. 4D, the encapsulant 113 for encapsulating the PMIC 102 and the passive element 104 may be formed in the through-hole 111*a* of the core member 111, and thus the core layer 110*a* of the first interposer package 100*a* may be formed.

The encapsulant 113 may encapsulate or protect the PMIC 102 and the passive element 104, and may provide an insulating region. An encapsulation form of the encapsulant 113 is not particularly limited, but may be a form in which the encapsulant 113 surrounds at least portions of the PMIC 102 and the passive element 104. For example, the encapsulant 113 may cover side surfaces of the PMIC 102 and the passive element 104, and may further cover lower surfaces of the PMIC 102 and the passive element 104 (not illustrated in FIG. 4D). In addition, the encapsulant 113 may fill a space in the through-hole 111*a* of the core member 111. A material of the encapsulant 113 may be, for example, a photoimageable encapsulant (PIE), an insulating material such as ABF, or the like, for example.

Figure 4E:
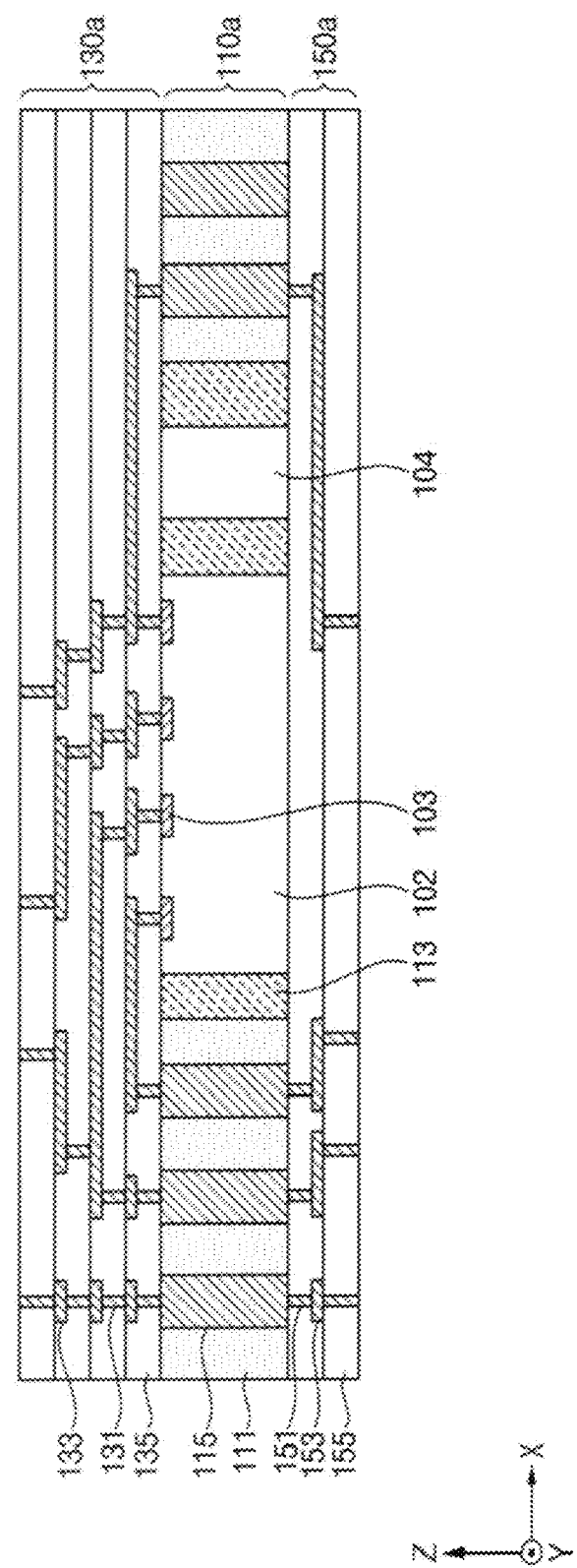

Referring to FIG. 4E, the first redistribution layer 130*a* may be formed on the core member 111 (e.g., on the core layer 110*a*). As a result, a manufacturing process of the first interposer package 100*a* may be completed.

The lowermost insulating layer of the plurality of insulating layers 135 may be formed on the core member 111 by a lamination process or a suitable applying process. After that, via-holes may be formed in the lowermost insulating layer by a photolithography process. After that, some of the vias 131 and some of the wirings 133 in or on the lowermost insulating layer may be formed by the plating process described above. In a similar manner, the remaining of the insulating layers 135, the remaining of the vias 131 and the remaining of the wirings 133 may be sequentially formed.

In some example embodiments, materials included in the plurality of vias 131 and the plurality of wirings 133 may be substantially the same as the materials included in the plurality of vias 151 and the plurality of wirings 153, and materials included in the plurality of insulating layers 135 may be substantially the same as the materials included in the plurality of insulating layers 155.

In some example embodiments, the uppermost insulating layer of the plurality of insulating layers 135 may be a passivation layer that protects the first interposer package 100*a* from external physical and/or chemical damage.

Although not illustrated in detail, the plurality of electrical connection structures may be formed on the first redistribution layer 130*a* and under the second redistribution layer 150*a* by a reflow process, or the like. In some example embodiments, the plurality of electrical connection structures may be formed of a conductive material, for example, a solder, or the like. However, this is only an example, and materials of the plurality of electrical connection structures are not limited thereto. The plurality of electrical connection structures may be a land, a ball, a pin, and/or the like. The plurality of electrical connection structures may be formed as a multilayer or single layer structure. When the plurality of electrical connection structures are formed as a multilayer structure, the plurality of electrical connection structures may include a copper (Cu) pillar and a solder. When the plurality of electrical connection structures are formed as a single layer structure, the plurality of electrical connection structures may include a tin-silver solder, copper (Cu), and/or the like. However, this is only an example, and the plurality of electrical connection structures are not limited thereto. The number, an interval, a disposition form, and the like, of the plurality of electrical connection structures are not particularly limited, but may be sufficiently modified depending on design particulars by those skilled in the art.

Although FIGS. 4A, 4B, 4C, 4D and 4E illustrate an example of manufacturing the first interposer package 100*a*, example embodiments are not limited thereto. For example, the first redistribution layer 130*a* may be formed first, and then the core layer 110*a* and the second redistribution layer 150*a* may be sequentially formed. For another example, the core layer 110*a* may be formed first, and then the first and second redistribution layers 130*a* and 150*a* may be sequentially formed.

Figure 5:
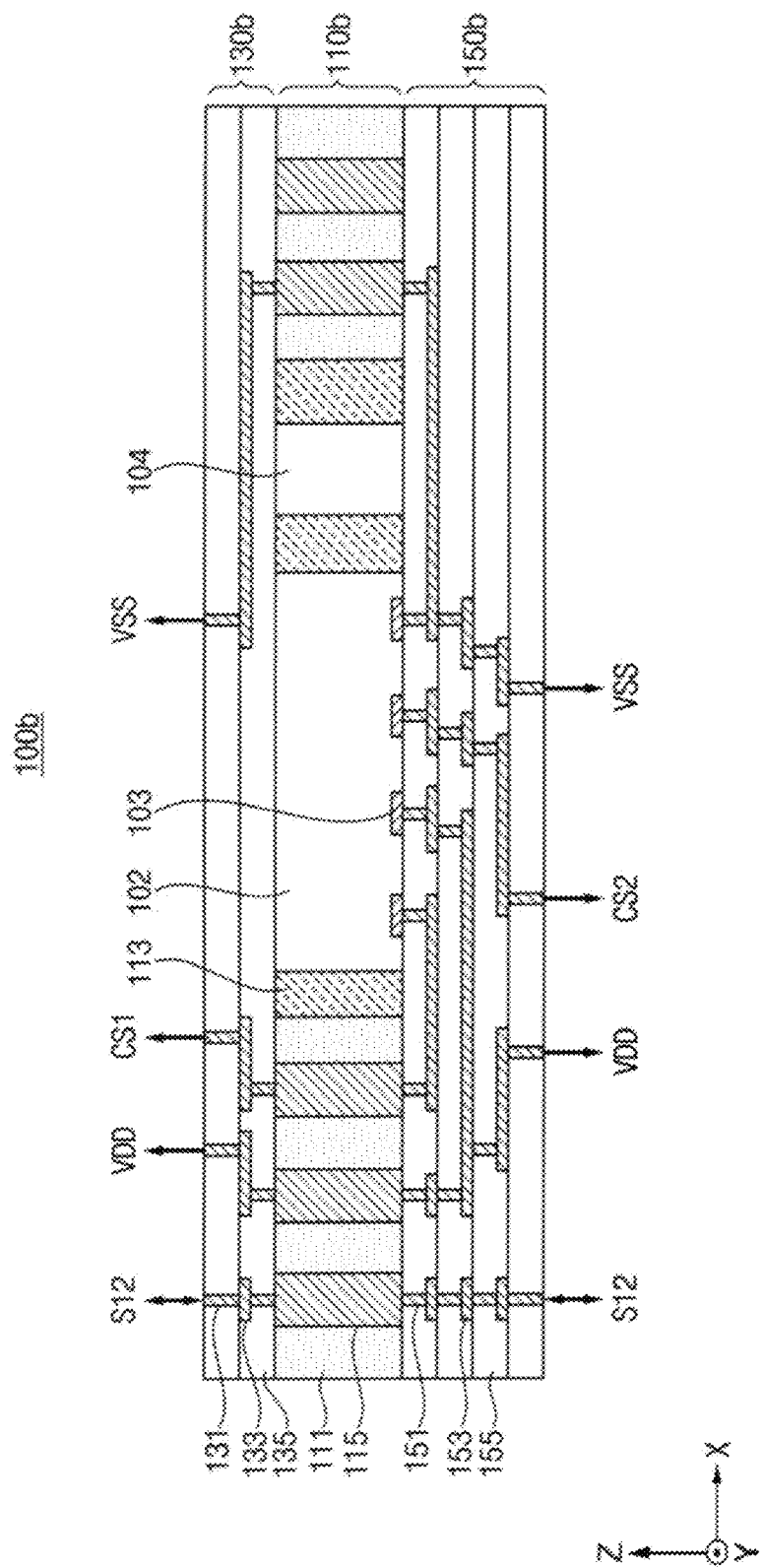
FIG. 5 is a diagram illustrating another example of a first interposer package included in a semiconductor package of FIG. 1.

FIG. 5 is a diagram illustrating another example of a first interposer package included in a semiconductor package of FIG. 1. The descriptions repeated with FIG. 3A will be omitted.

Referring to FIG. 5, a first interposer package 100*b* may include a core layer 110*b*, a first redistribution layer 130*b*, and a second redistribution layer 150*b*.

The first interposer package 100*b* may be substantially the same as the first interposer package 100*a* of FIG. 3A, except that an arrangement of the PMIC 102 is changed and an arrangement of the wirings is partially changed.

The PMIC 102 may include the active surface having the pads 103 thereon and the inactive surface opposite to the active surface. In the example of FIG. 5, the PMIC 102 may be disposed in face-down form such that the inactive surface is directed toward the first package 200.

The passive element 104, the core member 111, the encapsulant 113, the core vias 115, the plurality of vias 131 and 151, the plurality of wirings 133 and 153, and the plurality of insulating layers 135 and 155 may be substantially the same as the passive element 104, the core member 111, the encapsulant 113, the core vias 115, the plurality of vias 131 and 151, the plurality of wirings 133 and 153, and the plurality of insulating layers 135 and 155 in FIG. 3A, respectively.

Figure 6A:
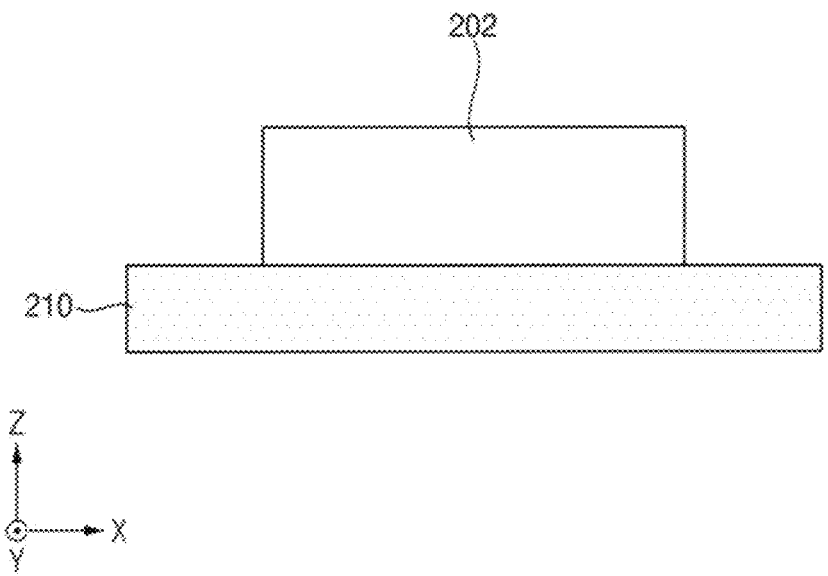
FIGS. 6A, 6B and 6C are cross-sectional views for describing a method of manufacturing a first package included in a semiconductor package of FIG. 1.
Figure 6B:
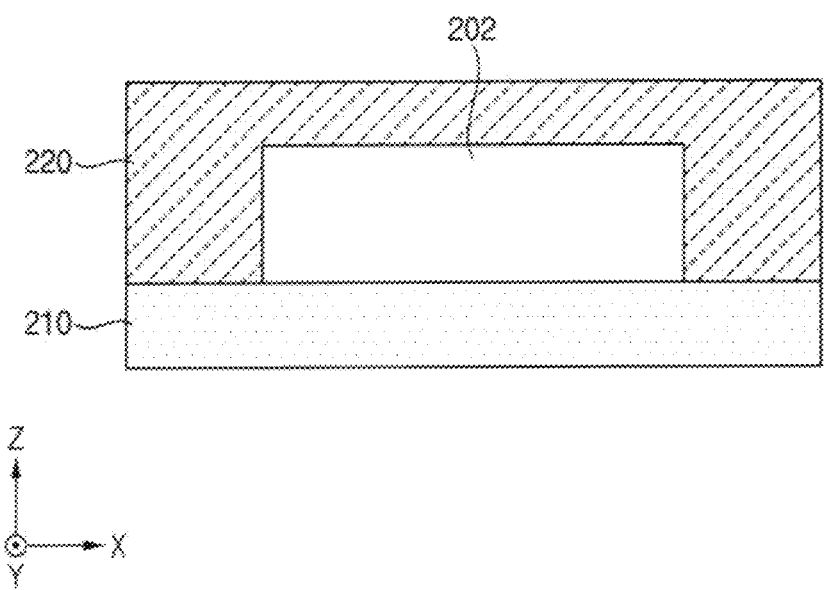
Figure 6C:
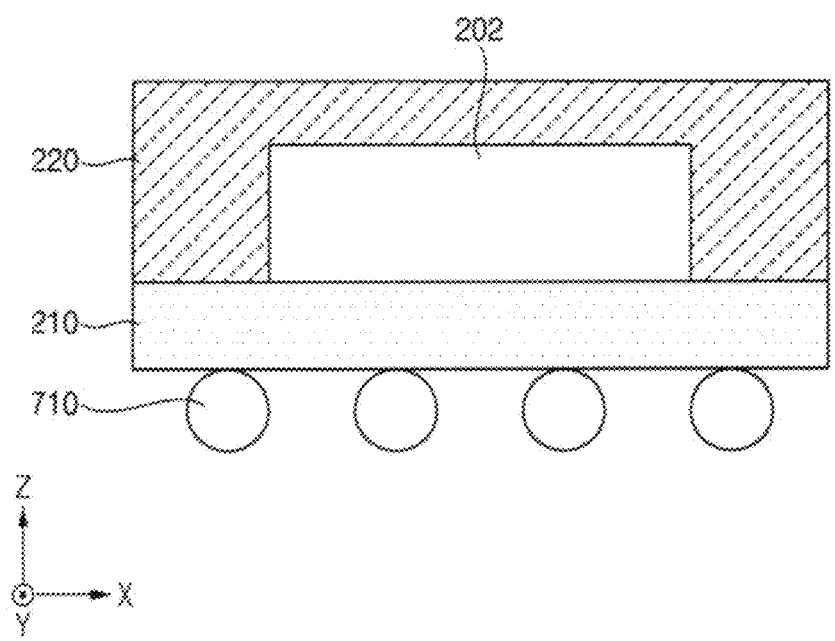

FIGS. 6A, 6B, and 6C are cross-sectional views for describing a method of manufacturing a first package included in a semiconductor package of FIG. 1.

Referring to FIG. 6A, the first semiconductor chip 202 may be disposed on a substrate 210. The substrate 210 may include a PCB substrate, for example. The first semiconductor chip 202 may be disposed in the face-up or face-down orientation on the substrate 210.

Although not illustrated in detail, in some example embodiments, the first semiconductor chip 202 may be implemented in the form of a flip chip that is electrically connected to the substrate 210 without bonding wires. In other example embodiments, the first semiconductor chip 202 may be implemented in the form of a non-flip chip or an epi-up chip that is electrically connected to the substrate 210 through bonding wires. In another implementation, the first semiconductor chip 202 may be implemented in a multi-stack structure in which a plurality of first semiconductor chips are stacked in a vertical direction.

Referring to FIG. 6B, an encapsulant 220 for encapsulating the first semiconductor chip 202 may be formed on the substrate 210. In some example embodiments, a material included in the encapsulant 220 may be substantially the same as the materials included in the encapsulant 113. In some example embodiments, the encapsulant 220 may be a passivation layer that protects the first package 200 from external physical and/or chemical damages.

Referring to FIG. 6C, the plurality of electrical connection structures 710 may be formed under the substrate 210. As a result, a manufacturing process of the first package 200 may be completed.

FIG. 7 is a cross-sectional view of another example of a first package included in a semiconductor package of FIG. 1.

Referring to FIG. 7, a first package 200a may include a core layer 230, redistribution layers 240 and 250, and an upper layer 260.

The first package 200a may be implemented with a package on package (PoP) scheme in which one package including the first semiconductor chip 202 is used as a substrate and another package including the other semiconductor chip 204 is on the one package that is used as the substrate. The first semiconductor chip 202 may be in the core layer 230, and the other semiconductor chip 204 may be in the upper layer 260.

A core member 231, an encapsulant 233, and core vias 235 included in the core layer 230 may be substantially similar to the core member 111, the encapsulant 113, and the core vias 115 in FIG. 3A, respectively. A plurality of vias 241 and 251, a plurality of wirings 243 and 253, and a plurality of insulating layers 245 and 255 that are included in the redistribution layers 240 and 250 may be substantially similar to the plurality of vias 131 and 151, the plurality of wirings 133 and 153, and the plurality of insulating layers 135 and 155 in FIG. 3A, respectively. An encapsulant included in the upper layer 260 may be formed on the redistribution layer 240 and may encapsulate the other semiconductor chip 204.

Although not illustrated in detail, the second package 300 may be manufactured as described with reference to FIGS. 6A, 6B and 6C, and/or may be implemented with the PoP scheme as described with reference to FIG. 7.

Figure 8:
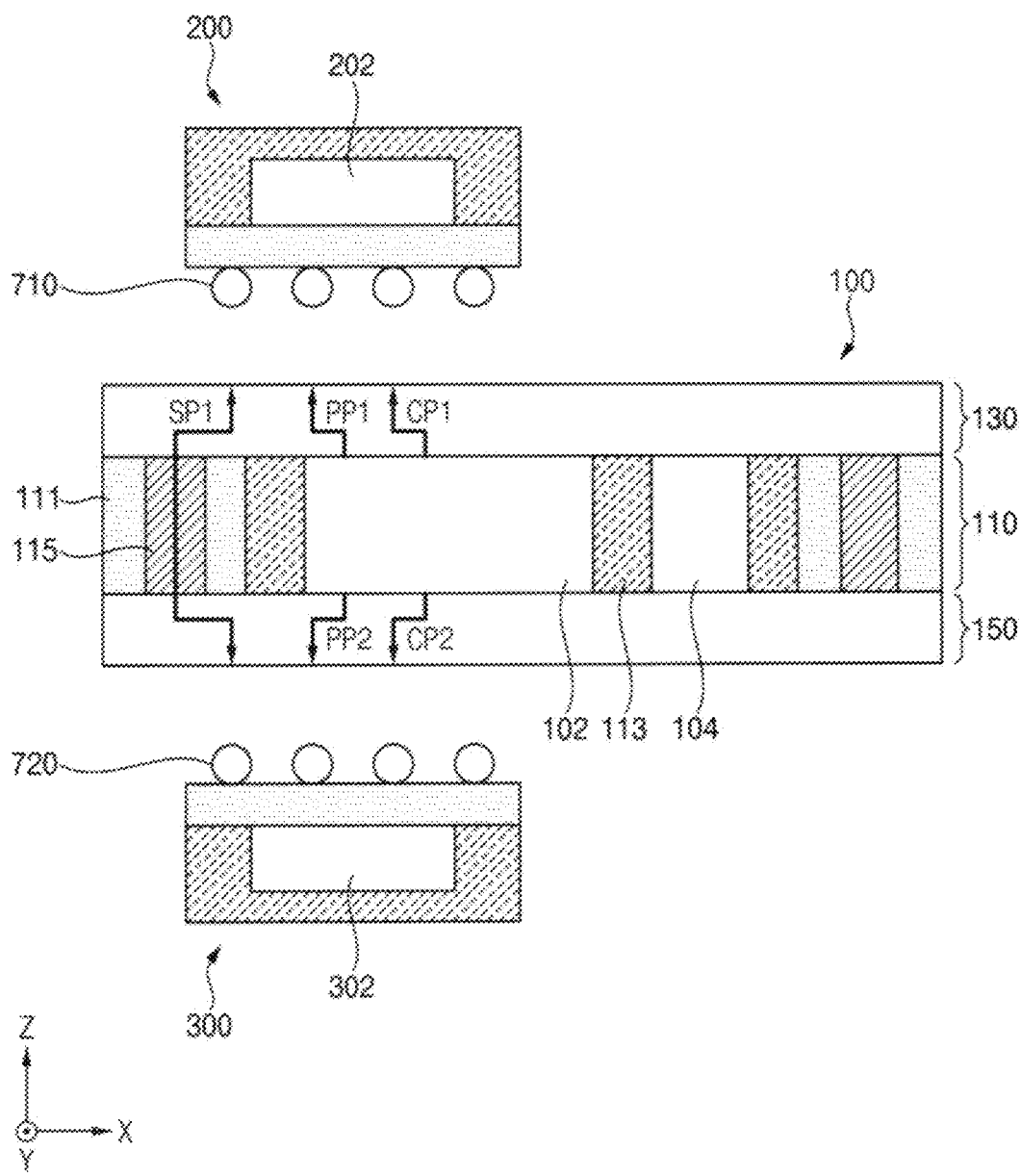
FIG. 8 is a cross-sectional view for describing a method of manufacturing a semiconductor package of FIG. 1.
}

FIG. 8 is a cross-sectional view for describing a method of manufacturing a semiconductor package of FIG. 1.

Referring to FIG. 8, the first package 200 may be on the first interposer package 100, and the first interposer package 100 and the first package 200 may be electrically connected using the plurality of electrical connection structures 710. In addition, the second package 300 may be under the first interposer package 100, and the first interposer package 100 and the second package 300 may be electrically connected using the plurality of electrical connection structures 720. As a result, a manufacturing process of the semiconductor package 10 may be completed.

Although FIG. 8 illustrates that the plurality of electrical connection structures 710 are formed on the first package 200 and the plurality of electrical connection structures 720 are formed on the second package 300, example embodiments are not limited thereto. For example, the plurality of electrical connection structures 710 and 720 may be formed on the first interposer package 100.

Figure 9:
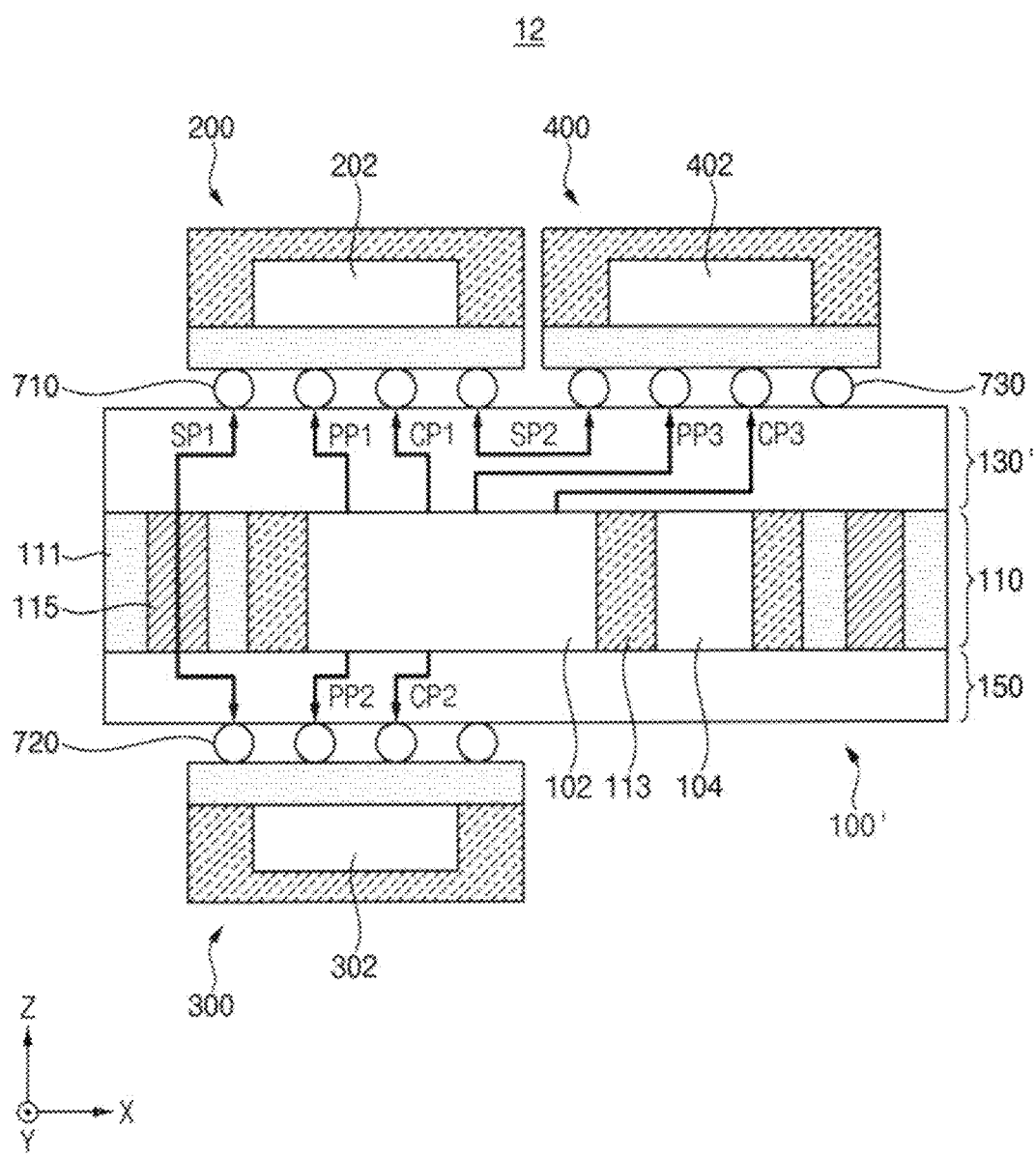
FIGS. 9 and 10 are cross-sectional views of a semiconductor package according to an example embodiment.
Figure 10:
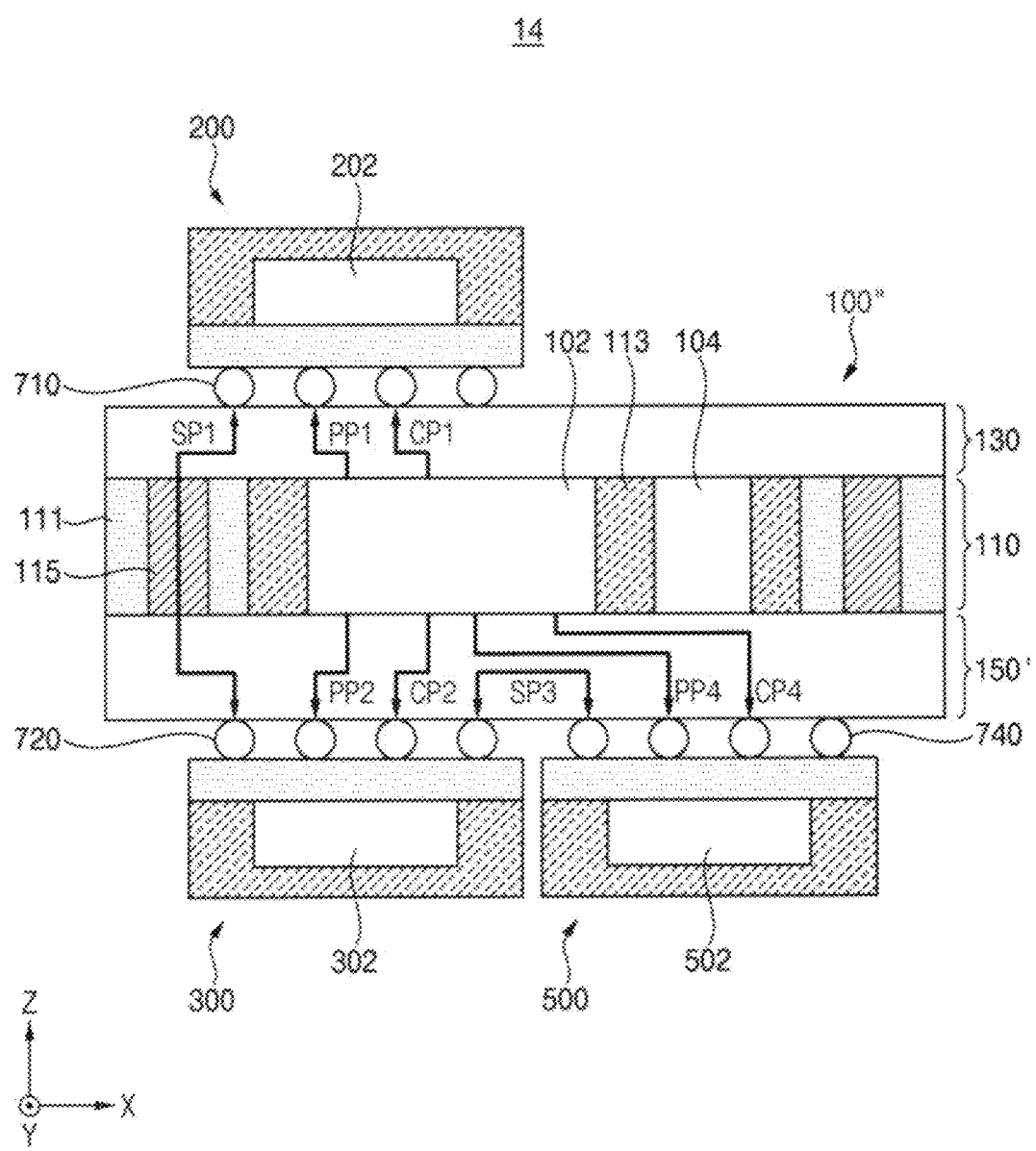

FIGS. 9 and 10 are cross-sectional views of a semiconductor package according to an example embodiment. The descriptions repeated with FIG. 1 will be omitted.

Referring to FIG. 9, a semiconductor package 12 may include a first interposer package 100', a first package 200, a second package 300, and a third package 400. The semiconductor package 12 may further include a plurality of electrical connection structures 710, 720, and 730.

The semiconductor package 12 may be substantially the same as the semiconductor package 10 of FIG. 1, except that the semiconductor package 12 may further include the third package 400 and the plurality of electrical connection structures 730, and a first redistribution layer 130' included in the first interposer package 100' is changed.

The third package 400 may include a third semiconductor chip 402. The third package 400 may be on the first interposer package 100' and may be spaced apart from the first package 200.

In some example embodiments, the third semiconductor chip 402 may be a semiconductor chip of a different type from the first and second semiconductor chips 202 and 302, or may be a semiconductor chip of the same type as one of the first and second semiconductor chips 202 and 302. In some example embodiments, the third package 400 may be manufactured as described with reference to FIGS. 6A, 6B and 6C, and/or may be implemented with the PoP scheme as described with reference to FIG. 7.

The first interposer package 100' may include a core layer 110, a first redistribution layer 130', a second redistribution layer 150, and a first signal path SP1. The first interposer package 100' may further include a second signal path SP2, power paths PP1, PP2, and PP3, and power control paths CP1, CP2, and CP3.

The second signal path SP2 may electrically connect the first package 200 with the third package 400. For example, both the first and third packages 200 and 400 may be on the first redistribution layer 130' and may be electrically connected to the first redistribution layer 130'. Thus, unlike the first signal path SP1, the second signal path SP2 may include only at least one of the first vias and at least one of the first wirings included in the first redistribution layer 130'. The first package 200 and the third package 400 may exchange signals through the second signal path SP2.

The power path PP3 may provide the power supply voltage to the third package 400. The power control path CP3 may provide a control signal that controls the provision of the power supply voltage to the third package 400. The power supply voltage and the control signal may be generated by the PMIC 102. The power path PP3 may be similar to the power path PP1. The power control path CP3 may be similar to the power control path CP1.

Although not illustrated in detail, the first interposer package 100' may further include a signal path that electrically connects the second package 300 with the third package 400.

The plurality of electrical connection structures 730 may be between the first interposer package 100 and the third package 400, and may electrically connect the first interposer package 100 with the third package 400.

Referring to FIG. 10, a semiconductor package 14 may include a first interposer package 100'', a first package 200, a second package 300, and a fourth package 500. The semiconductor package 14 may further include a plurality of electrical connection structures 710, 720, and 740.

The semiconductor package 14 may be substantially the same as the semiconductor package 10 of FIG. 1, except that the semiconductor package 14 may further include the fourth package 500 and the plurality of electrical connection structures 740, and a second redistribution layer 150' included in the first interposer package 100'' is changed.

The fourth package 500 may include a fourth semiconductor chip 502. The fourth package 500 may be under the first interposer package 100" and spaced apart from the second package 300.

In some example embodiments, the fourth semiconductor chip 502 may be a semiconductor chip of a different type from the first and second semiconductor chips 202 and 302, or may be a semiconductor chip of the same type as one of the first and second semiconductor chips 202 and 302. In some example embodiments, the fourth package 500 may be manufactured as described with reference to FIGS. 6A, 6B, and 6C, and/or may be implemented with the PoP scheme as described with reference to FIG. 7.

The first interposer package 100" may include a core layer 110, a first redistribution layer 130, a second redistribution layer 150', and a first signal path SP1. The first interposer package 100" may further include a third signal path SP3, power paths PP1, PP2, and PP4, and power control paths CP1, CP2, and CP4.

The third signal path SP3 may electrically connect the second package 300 with the fourth package 500. For example, both the second and fourth packages 300 and 500 may be under the second redistribution layer 150' and may be electrically connected to the second redistribution layer 150'. Thus, unlike the first signal path SP1, the third signal path SP3 may include only at least one of the second vias and at least one of the second wirings included in the second redistribution layer 150'. The second package 300 and the fourth package 500 may exchange signals through the third signal path SP3.

The power path PP4 may provide the power supply voltage to the fourth package 500. The power control path CP4 may provide a control signal that controls the provision of the power supply voltage to the fourth package 500. The power supply voltage and the control signal may be generated by the PMIC 102. The power path PP4 may be similar to the power path PP2, and the power control path CP4 may be similar to the power control path CP2.

Although not illustrated in detail, the first interposer package 100" may further include a signal path that electrically connects the first package 200 with the fourth package 500.

The plurality of electrical connection structures 740 may be between the first interposer package 100 and the fourth package 500, and may electrically connect the first interposer package 100 with the fourth package 500.

In some example embodiments, the semiconductor package may include all of the first through fourth packages 200, 300, 400, and 500, or may include any number of (e.g., five or more) packages.

Figure 11:
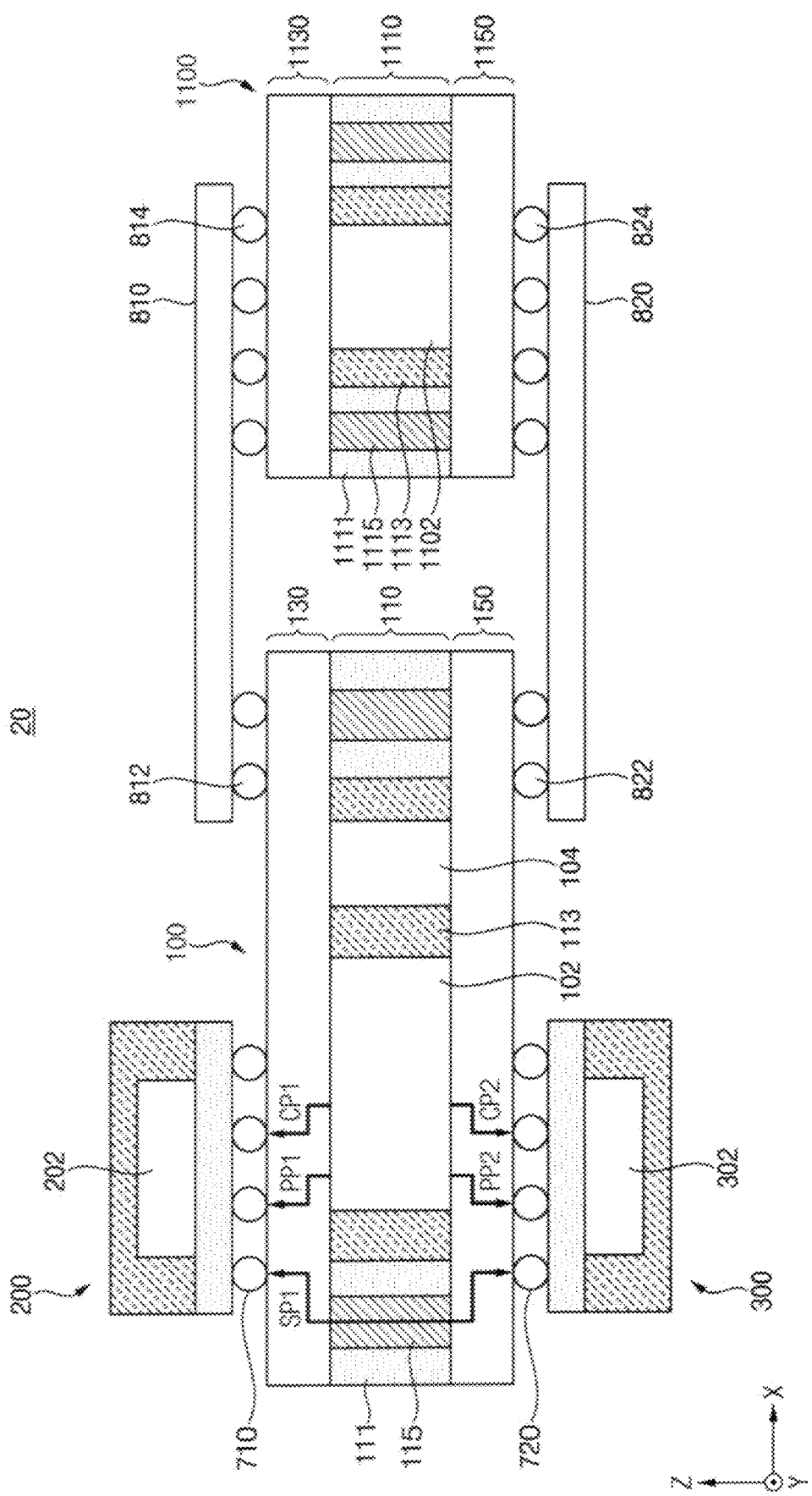
FIG. 11 is a cross-sectional view of a semiconductor package according to an example embodiment.

FIG. 11 is a cross-sectional view of a semiconductor package according to an example embodiment. The descriptions repeated with FIG. 1 will be omitted.

Referring to FIG. 11, a semiconductor package 20 may include a first interposer package 100, a first package 200, and a second package 300. The semiconductor package 20 may further include a first PCB 810, a second PCB 820, a second interposer package 1100, and a plurality of electrical connection structures 710, 720, 812, 814, 822, and 824.

The semiconductor package 20 may be substantially the same as the semiconductor package 10 of FIG. 1, except that the semiconductor package 20 further includes the first and second PCBs 810 and 820, the second interposer package 1100, and the plurality of electrical connection structures 812, 814, 822, and 824.

The second interposer package 1100 may be spaced apart from the first interposer package 100. For example, the second interposer package 1100 may be on the same plane as the first interposer package 100, and may be in a space between the first package 200 and the second package 300 and spaced apart from the first interposer package 100.

The second interposer package 1100 may have a structure substantially the same as that of the first interposer package 100. The second interposer package 1100 may include a core layer 1110 and redistribution layers 1130 and 1150.

A PMIC 1102, a core member 1111, an encapsulant 1113, and core vias 1115 included in the core layer 1110 may be substantially the same as the PMIC 102, the core member 111, the encapsulant 113, and the core vias 115 in FIG. 1, respectively. The redistribution layers 1130 and 1150 may be substantially the same as the first and second redistribution layers 130 and 150 in FIG. 1, respectively.

Although not illustrated, the core layer 1110 may further include a passive element. In addition, the second interposer package 1100 may further include at least one signal path corresponding to the first signal path SP1, at least one power path corresponding to the power paths PP1 and PP2, and at least one power control path corresponding to the power control paths CP1 and CP2.

In some example embodiments, as illustrated in FIG. 11, a size (or area) of the second interposer package 1100 may be smaller than a size (or area) of the first interposer package 100. However, example embodiments are not limited thereto, and the sizes (or areas) of the first and second interposer packages 100 and 1100 may be changed according to example embodiments.

The first PCB 810 may be on the first and second interposer packages 100 and 1100, and may electrically connect the first interposer package 100 with the second interposer package 1100. The second PCB 820 may be under the first and second interposer packages 100 and 1100, and may electrically connect the first interposer package 100 with the second interposer package 1100. For example, each of the first and second PCBs 810 and 820 may be a single-layered or multi-layered circuit board, and may include wirings and vias connected to the wirings. The first PCB 810 may be referred to as a master PCB, and the second PCB 820 may be referred to as a slave PCB.

The plurality of electrical connection structures 812 may be between the first interposer package 100 and the first PCB 810, and the plurality of electrical connection structures 814 may be between the second interposer package 1100 and the first PCB 810. The first and second interposer packages 100 and 1100 and the first PCB 810 may be electrically connected to each other by the plurality of electrical connection structures 812 and 814.

The plurality of electrical connection structures 822 may be between the first interposer package 100 and the second PCB 820, and the plurality of electrical connection structures 824 may be between the second interposer package 1100 and the second PCB 820. The first and second interposer packages 100 and 1100 and the second PCB 820 may be electrically connected to each other by the plurality of electrical connection structures 822 and 824.

In some example embodiments, the first interposer package 100, the second interposer package 1100, the first PCB 810, and the second PCB 820 may be individually, independently, and separately manufactured through separate processes, and then may be electrically connected to each other by the plurality of electrical connection structures 812, 814, 822, and 824.

The semiconductor package 20 according to an example embodiment may include the first and second interposer packages 100 and 1100 having a multi-function double side interposer structure. Each of the first and second interposer packages 100 and 1100 may include components for supplying the power, and may also include a component for electrically connecting the packages on the upper and lower surfaces of the interposer packages. In addition, the first and second interposer packages 100 and 1100 may be electrically connected to each other based on double-sided soldering and using the first and second PCBs 810 and 820. The two interposer packages 100 and 1100 may be connected to each other in the form of bridge, and thus the function, size, etc. of the interposers may be efficiently expanded.

Figure 12A:
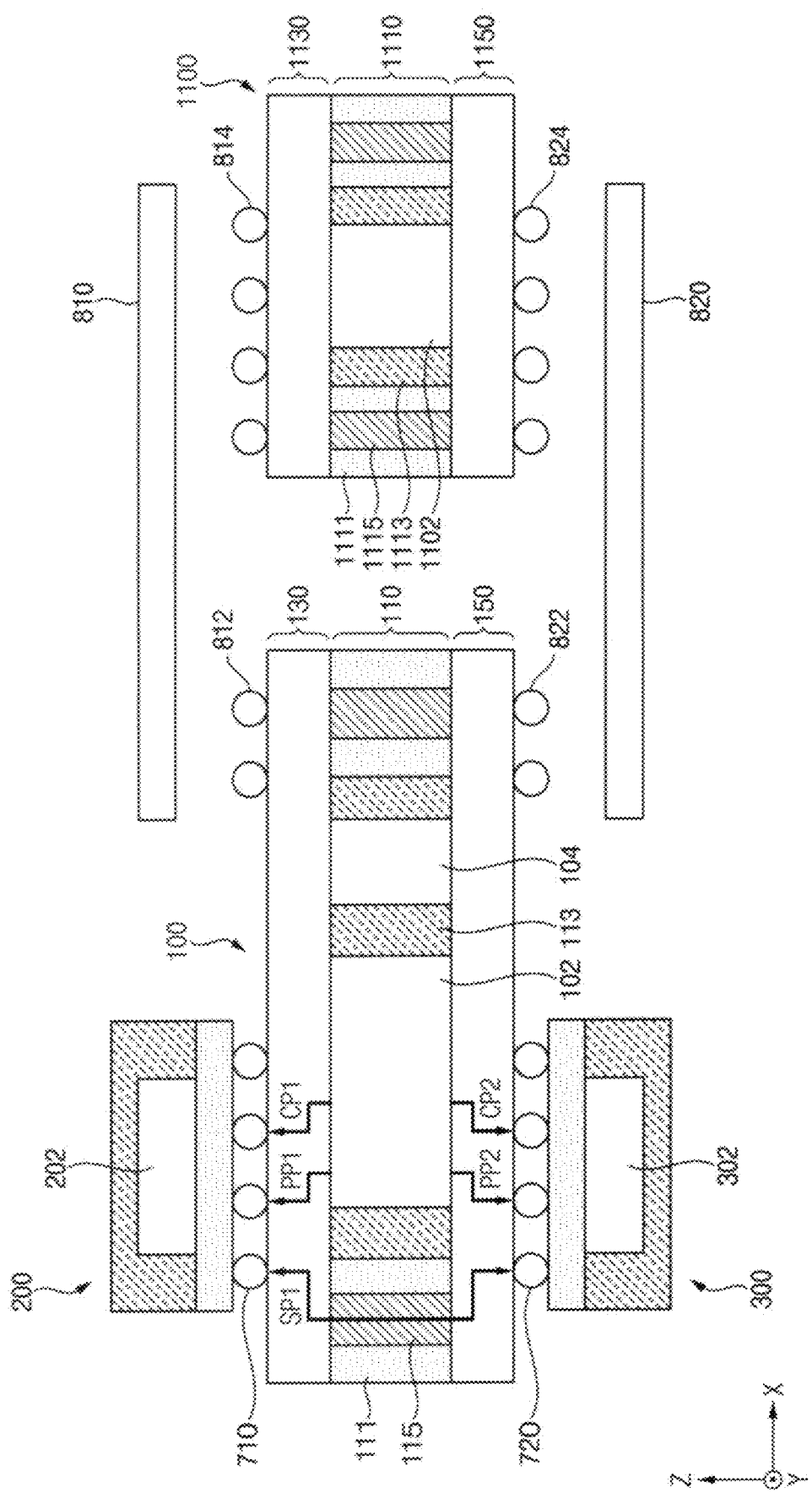
FIGS. 12A and 12B are cross-sectional views for describing a method of manufacturing a semiconductor package of FIG. 11.
Figure 12B:
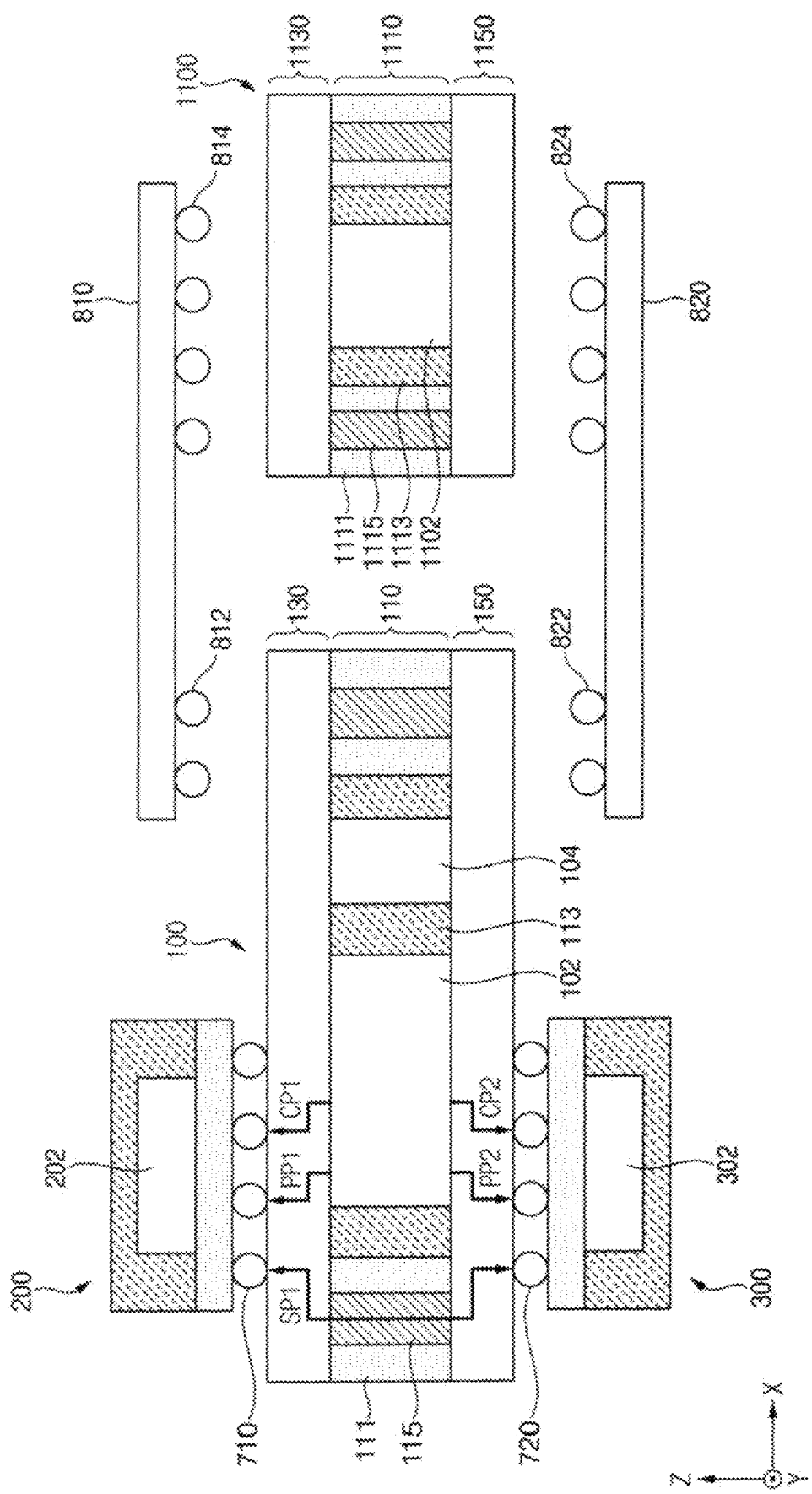

FIGS. 12A and 12B are cross-sectional views for describing a method of manufacturing a semiconductor package of FIG. 11.

Referring to FIGS. 12A and 12B, after the first interposer package 100 and the first and second packages 200 and 300 are electrically connected using the plurality of electrical connection structures 710 and 720, the second interposer package 1100 may be spaced apart from the first interposer package 100, the first PCB 810 may be on the first and second interposer packages 100 and 1100, and the first and second interposer packages 100 and 1100 and the first PCB 810 may be electrically connected using the plurality of electrical connection structures 812 and 814. In addition, the second PCB 820 may be under the first and second interposer packages 100 and 1100, and the first and second interposer packages 100 and 1100 and the second PCB 820 may be electrically connected using the plurality of electrical connection structures 822 and 824.

In some example embodiments, as illustrated in FIG. 12A, the plurality of electrical connection structures 812, 814, 822, and 824 may be formed on the first and second interposer packages 100 and 1100. In other example embodiments, as illustrated in FIG. 12B, the plurality of electrical connection structures 812, 814, 822, and 824 may be formed on the first and second PCBs 810 and 820.

FIG. 13 is a cross-sectional view of a semiconductor package according to an example embodiment. The descriptions repeated with FIGS. 1 and 11 will be omitted.

Referring to FIG. 13, a semiconductor package 22 may include a first interposer package 100, a first package 200, and a second package 300. The semiconductor package 22 may further include a first PCB 810, a second PCB 820, a fifth package 900, a second interposer package 1100, and a plurality of electrical connection structures 710, 720, 750, 812, 814, 822, and 824.

The semiconductor package 22 may be substantially the same as the semiconductor package 20 of FIG. 11, except that the semiconductor package 22 further includes the fifth package 900 and the plurality of electrical connection structures 750.

The fifth package 900 may include a fifth semiconductor chip 902, and may be on the first PCB 810.

In some example embodiments, the fifth semiconductor chip 902 may be a semiconductor chip of a different type from the first and second semiconductor chips 202 and 302, or may be a semiconductor chip of the same type as one of the first and second semiconductor chips 202 and 302. In some example embodiments, the fifth package 900 may be manufactured as described with reference to FIGS. 6A, 6B, and 6C, and/or may be implemented with the PoP scheme as described with reference to FIG. 7.

Although not illustrated in detail, one of the first and second interposer packages 100 and 1100 and the first PCB 810 may include a power path and a power control path that provide a power supply voltage and a control signal to the fifth package 900. Although not illustrated in detail, the first interposer package 100 and the first PCB 810 may include a signal path that electrically connects one of the first and second packages 200 and 300 with the fifth package 900.

In some example embodiments, the fifth package 900 may be under the second PCB 820, and/or the semiconductor package 22 may further include a sixth package under the second PCB 820. In some example embodiments, the semiconductor packages 20 and 22 may further include at least one of the third and fourth packages 400 and 500.

Although FIGS. 11 through 13 illustrate examples where two interposer packages 100 and 1100 are connected to each other in the form of bridge, example embodiments are not limited thereto, and three or more interposer packages may be connected to each other in the form of bridge.

Figure 14:
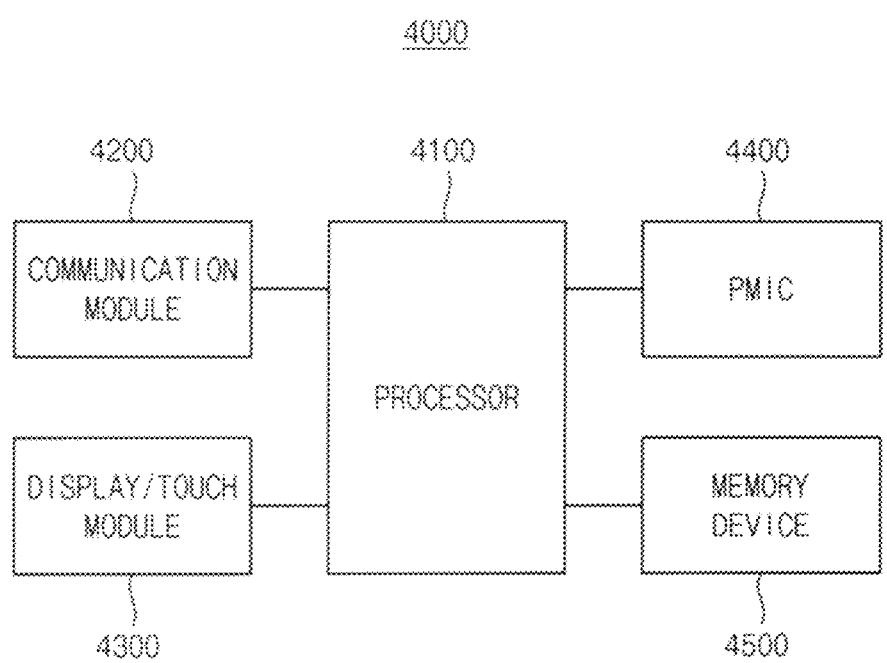
FIG. 14 is a block diagram illustrating an electronic system according to an example embodiment.

FIG. 14 is a block diagram illustrating an electronic system according to an example embodiment.

Referring to FIG. 14, an electronic system 4000 may include at least one processor 4100, a communication module 4200, a display/touch module 4300, a PMIC 4400, and a memory device 4500. For example, the electronic system 4000 may be a mobile system or a computing system.

The processor 4100 may control operations of the electronic system 4000. The processor 4100 may execute an operating system and at least one application to provide an internet browser, games, videos, or the like. The communication module 4200 may be controlled by the processor 4100 and may perform wireless or wired communications with an external system. The display/touch module 4300 may display data processed by the processor 4100, and/or receive data through a touch panel. The PMIC 4400 may control power of the electronic system 4000. The memory device 4500 may store user data and/or temporarily store data used for processing operations of the electronic system 4000.

At least portions of the electronic system 4000 may be implemented in the form of a semiconductor package according to example embodiments. For example, the PMIC 4400 may be included in the interposer package included in the semiconductor package according to example embodiments, the processor 4100 may correspond to one semiconductor chip included in the semiconductor package according to example embodiments, and at least one of the communication module 4200, the display/touch module 4300, and the memory device 4500 may correspond to another semiconductor chip included in the semiconductor package according to example embodiments.

Embodiments may be applied to various electronic devices and/or systems including the semiconductor packages. For example, embodiments may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

By way of summation and review, there has been increased attention for fan-out semiconductor packages because they have a compact size and may allow a plurality of pins to be implemented by redistributing electrical connection structures outwardly of a region in which the semiconductor chip is disposed. In addition, there has been increased attention on semiconductor packages providing a multi-function/integration structure within a limited area.

As described above, embodiments relate generally to semiconductor integrated circuits, and more particularly to semiconductor packages having a highly integrated system-in-package (SIP) and methods of manufacturing the semiconductor packages.

Embodiments may provide a semiconductor package capable of efficiently implementing a highly integrated system-in-package (SIP) using a multi-function double side interposer structure.

Embodiments may provide a method of manufacturing a semiconductor package capable of efficiently implementing a highly integrated SIP using a multi-function double side interposer structure.

A semiconductor package according to an example embodiment may include an interposer package having a multi-function double side interposer structure. The interposer package may include components (e.g., a PMIC and a passive element) for supplying the power, and may also include a component (e.g., a first signal path) for electrically connecting packages on upper and lower surfaces of the interposer package. The interposer package may be implemented in the form of a superset including all of the above-described components, and thus the semiconductor package may have relatively simplified wirings, simplified configurations, reduced size, and/or reduced thickness. In addition, a semiconductor package according to an example embodiment may include two or more interposer packages that are connected to each other in the form of bridge based on double-sided soldering, and thus the function, size, etc. of the interposers may be efficiently expanded.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a first package including a first semiconductor chip;
   a second package under the first package, the second package including a second semiconductor chip; and
   a first interposer package between the first package and the second package, the first interposer package including:
   a power management integrated circuit (PMIC) configured to supply power to the first package and the second package;
   a core member having a through-hole in which the PMIC is disposed;
   a first redistribution layer on the core member, and electrically connected to the first package via first solder balls;
   a second redistribution layer under the core member, and electrically connected to the second package via second solder balls;
   core vias penetrating the core member, and electrically connecting the first redistribution layer with the second redistribution layer;
   a first signal path electrically connecting the first package with the second package, the first signal path including only elements in the first redistribution layer, elements in the second redistribution layer, and one of the core vias,
   a power path configured to provide a power supply voltage to the first package and the second package,
   a first power control path from the PMIC only to the first package among the first and second packages, and configured to provide a first control signal that controls provision of the power supply voltage to the first package, and
   a second power control path from the PMIC only to the second package among the first and second packages, and configured to provide a second control signal that controls provision of the power supply voltage to the second package.

2. The semiconductor package as claimed in claim 1, wherein each of the core vias is a single element that has an upper surface coplanar with an upper surface of the PMIC.

3. The semiconductor package as claimed in claim 1, wherein the first interposer package further includes a passive element in the through-hole, and spaced apart from the PMIC.

4. The semiconductor package as claimed in claim 1, wherein the first interposer package further includes an encapsulant in the through-hole, and encapsulating the PMIC.

5. The semiconductor package as claimed in claim 1, further comprising a third package including a third semiconductor chip, the third package being on the first interposer package and spaced apart from the first package,
   wherein the first interposer package further includes a second signal path that electrically connects the first package with the third package.

6. The semiconductor package as claimed in claim 5, wherein the second signal path includes at least one of first vias and at least one of first wirings that are included in the first redistribution layer.

7. The semiconductor package as claimed in claim 5, further comprising a fourth package including a fourth semiconductor chip, the fourth package being under the first interposer package and spaced apart from the second package,
   wherein the first interposer package further includes a third signal path that electrically connects the second package with the fourth package.

8. The semiconductor package as claimed in claim 7, wherein the third signal path includes at least one of second vias and at least one of second wirings that are included in the second redistribution layer.

9. The semiconductor package as claimed in claim 1, further comprising:
   a second interposer package spaced apart from the first interposer package;
   a first printed circuit board (PCB) on the first and second interposer packages, and electrically connecting the first interposer package with the second interposer package; and
   a second PCB under the first and second interposer packages, and electrically connecting the first interposer package with the second interposer package.

10. The semiconductor package as claimed in claim 9, further comprising:
    a plurality of first electrical connection structures between the first and second interposer packages and the first PCB, and electrically connecting the first and second interposer packages with the first PCB; and a plurality of second electrical connection structures between the first and second interposer packages and the second PCB, and electrically connecting the first and second interposer packages with the second PCB.

11. The semiconductor package as claimed in claim 10, wherein the plurality of first and second electrical connection structures are formed on the first and second interposer packages.

12. The semiconductor package as claimed in claim 10, wherein the plurality of first and second electrical connection structures are formed on the first and second PCBs.

13. The semiconductor package as claimed in claim 1, wherein:
the PMIC includes an active surface having pads thereon, and an inactive surface opposite to the active surface, and
the PMIC is disposed in face-up orientation such that the active surface is directed toward the first package.

14. The semiconductor package as claimed in claim 1, wherein:
the PMIC includes an active surface having pads thereon, and an inactive surface opposite to the active surface, and
the PMIC is disposed in face-down orientation such that the inactive surface is directed toward the first package.

15. The semiconductor package as claimed in claim 1, wherein the first interposer package is connected to the first package and the second package only via the first solder balls and the second solder balls, respectively, without wiring bonding outside the first interposer package.

16. The semiconductor package as claimed in claim 1, wherein the first solder balls are arranged uniformly along a majority of an uppermost surface of the first redistribution layer facing the first package, and the second solder balls are arranged uniformly along a majority of a lowermost surface of the second redistribution layer facing the second package.

17. A method of manufacturing a semiconductor package, the method comprising:
providing a first package including a first semiconductor chip;
providing a second package including a second semiconductor chip;
fabricating a first interposer package; and
electrically connecting the first package, the second package, and the first interposer package by disposing the first interposer package between the first package and the second package,
wherein fabricating the first interposer package includes:
providing a core member;
forming a through-hole and via-holes penetrating the core member;
forming core vias in the via-holes;
disposing a power management integrated circuit (PMIC) in the through-hole, the PMIC configured to supply power to the first package and the second package;
forming a first redistribution layer on the core member, the first redistribution layer being electrically connected to the first package via first solder balls; and
forming a second redistribution layer under the core member, the second redistribution layer being electrically connected to the second package via second solder balls, the core vias electrically connecting the first redistribution layer with the second redistribution layer, and wherein a first signal path that electrically connects the first package with the second package is formed in the first interposer package and includes only elements in the first redistribution layer, one of the core vias, and elements in the second redistribution layer, wherein the first interposer package further includes:
a power path configured to provide a power supply voltage to the first package and the second package,
a first power control path from the PMIC only to the first package among the first and second packages, and configured to provide a first control signal that controls provision of the power supply voltage to the first package, and
a second power control path from the PMIC only to the second package among the first and second packages, and configured to provide a second control signal that controls provision of the power supply voltage to the second package.

18. The method as claimed in claim 17, further comprising:
fabricating a second interposer package different from the first interposer package;
electrically connecting the first interposer package with the second interposer package through a first printed circuit board (PCB) by disposing the first PCB on the first and second interposer packages; and
electrically connecting the first interposer package with the second interposer package through a second PCB by disposing the second PCB under the first and second interposer packages.

19. A semiconductor package, comprising:
a first package including a first semiconductor chip including an application processor;
a second package under the first package, the second package including a second semiconductor chip including a memory device;
a first interposer package between the first package and the second package;
a plurality of first electrical connection structures between the first package and the first interposer package, and electrically connecting the first package with the first interposer package; and
a plurality of second electrical connection structures between the first interposer package and the second package, and electrically connecting the first interposer package with the second package,
wherein the first interposer package includes:
a power management integrated circuit (PMIC) configured to supply power to the first package and the second package;
a passive element spaced apart from the PMIC;
a core member having a through-hole in which the PMIC and the passive element are disposed;
an encapsulant in the through-hole, and encapsulating the PMIC and the passive element;
a first redistribution layer on the core member, and electrically connected to the first package via first solder balls;
a second redistribution layer under the core member, and electrically connected to the second package via second solder balls;
core vias penetrating the core member, and electrically connecting the first redistribution layer with the second redistribution layer;
a first signal path electrically connecting the first package with the second package;

a power path configured to provide a power supply voltage to the first package and the second package;

a first power control path from the PMIC only to the first package among the first and second packages, and configured to provide a first control signal that controls provision of the power supply voltage to the first package; and a second power control path from the PMIC only to the second package among the first and second packages, and configured to provide a second control signal that controls provision of the power supply voltage to the second package, and wherein the first signal path includes only elements included in the first redistribution layer, one of the core vias, and elements included in the second redistribution layer.

* * * * *